(12) United States Patent
Xie et al.

(10) Patent No.: US 11,239,119 B2
(45) Date of Patent: Feb. 1, 2022

(54) REPLACEMENT BOTTOM SPACER FOR VERTICAL TRANSPORT FIELD EFFECT TRANSISTORS

(71) Applicant: International Business Machines Corporation, Armonk, NY (US)

(72) Inventors: Ruilong Xie, Niskayuna, NY (US); Heng Wu, Guilderland, NY (US); Jay Strane, Warwick, NY (US); Hemanth Jagannathan, Niskayuna, NY (US); Lan Yu, Voorheesville, NY (US); Tao Li, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 16/585,348

(22) Filed: Sep. 27, 2019

(65) Prior Publication Data

US 2021/0098597 A1   Apr. 1, 2021

(51) Int. Cl.
| | |
|---|---|
| *H01L 21/8234* | (2006.01) |
| *H01L 29/66* | (2006.01) |
| *H01L 29/08* | (2006.01) |
| *H01L 29/10* | (2006.01) |
| *H01L 27/088* | (2006.01) |

(Continued)

(52) U.S. Cl.
CPC .... *H01L 21/823487* (2013.01); *H01L 27/088* (2013.01); *H01L 29/0847* (2013.01); *H01L 29/1037* (2013.01); *H01L 29/41741* (2013.01); *H01L 29/6653* (2013.01); *H01L 29/6656* (2013.01); *H01L 29/66553* (2013.01); *H01L 29/66666* (2013.01); *H01L 29/7827* (2013.01)

(58) Field of Classification Search
CPC ............ H01L 29/6653; H01L 29/6656; H01L 29/66553; H01L 29/7827; H01L 27/2454; H01L 21/823487; H01L 21/823885
See application file for complete search history.

(56) References Cited

U.S. PATENT DOCUMENTS

| | | | |
|---|---|---|---|
| 9,368,572 B1 * | 6/2016 | Cheng | ................. H01L 27/1248 |
| 9,443,982 B1 | 9/2016 | Balakrishnan et al. | |
| 9,698,245 B2 | 7/2017 | Cheng et al. | |

(Continued)

OTHER PUBLICATIONS

N. Breil et al., "Highly-selective superconformal CVD Ti silicide process enabling area-enhanced contacts for next-generation CMOS architectures," Symposium on VLSI Technology, 2017, pp. T216-T217.

(Continued)

*Primary Examiner* — Laura M Menz
*Assistant Examiner* — Candice Chan
(74) *Attorney, Agent, or Firm* — Fleit Intellectual Property Law; Thomas S. Grzesik

(57) ABSTRACT

A method of forming a vertical channel semiconductor structure, comprises forming a source/drain layer in contact with at least one semiconductor fin. A first sacrificial layer is formed over the source/drain layer. A second sacrificial layer is formed over the first sacrificial layer. A trench is formed in the second sacrificial layer to expose a portion of the first sacrificial layer. After forming the second sacrificial layer, the first sacrificial layer is selectively removed to form a cavity under the second sacrificial layer. A spacer layer is then formed within the cavity.

20 Claims, 24 Drawing Sheets

(51) Int. Cl.
 *H01L 29/417* (2006.01)
 *H01L 29/78* (2006.01)

(56) References Cited

U.S. PATENT DOCUMENTS

| | | |
|---|---|---|
| 9,748,380 B1 | 8/2017 | Lie et al. |
| 9,780,194 B1 | 10/2017 | Balakrishnan et al. |
| 9,911,804 B1 | 3/2018 | Mallela et al. |
| 9,935,018 B1 | 4/2018 | Xie et al. |
| 10,014,370 B1 | 7/2018 | Xie et al. |
| 2016/0104798 A1 | 4/2016 | Kim |
| 2018/0308743 A1* | 10/2018 | Cheng ............. H01L 21/823487 |

OTHER PUBLICATIONS

S. A. Chew et al., "Replacement Metal Contact Using Sacrificial ILD0 for Wrap Around Contact in Scaled FinFET Technology," International Interconnect Technology Conference (IITC), 2018, pp. 33-35.

\* cited by examiner

REPLACEMENT BOTTOM SPACER FOR VERTICAL TRANSPORT FIELD EFFECT TRANSISTORS

BACKGROUND OF THE INVENTION

The present invention generally relates to the field of semiconductors, and more particularly relates to vertical field effect transistors.

Vertical field effect transistors (VTFETs or VFETs) are becoming viable device options for semiconductor devices, for example, complementary metal oxide semiconductor (CMOS) devices, beyond 5 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method of forming a vertical channel semiconductor structure comprises forming a source/drain layer in contact with at least one semiconductor fin. A first sacrificial layer is formed over the source/drain layer. A second sacrificial layer is formed over the first sacrificial layer. A trench is formed in the second sacrificial layer to expose a portion of the first sacrificial layer. After forming the second sacrificial layer, the first sacrificial layer is selectively removed to form a cavity under the second sacrificial layer. A spacer layer is then formed within the cavity.

In a further embodiment, another method of forming a vertical channel semiconductor structure comprises forming a selective metal layer on a top surface and sidewalls of a source/drain layer formed in contact with a plurality of semiconductor fins, and further on sidewalls of the plurality of semiconductor fins. Sacrificial spacers are formed on the sidewalls of the plurality of semiconductor fins and a top surface of the selective metal layer. Oxide layers are formed between the sacrificial spacers and on a top surface of exposed portions of the selective metal layer. The sacrificial spacers are recessed down to at least a top surface of at least one of the oxide layers. The oxide layers and the selective metal layer are removed forming a first cavity under and a second cavity between the recessed sacrificial spacers. A spacer layer is formed within the first cavity and the second cavity.

In another embodiment, a vertical channel semiconductor device comprises a plurality of semiconductor fins and at least one bottom source/drain formed in contact with the plurality of semiconductor fins. At least one bottom spacer is formed/disposed on the at least one bottom source/drain and adjacent to sidewalls of the plurality of semiconductor fins, wherein the at least one bottom spacer comprises one or more seams therein. At least one top spacer is formed above the at least one bottom spacer. At least one top source/drain is formed above the bottom source/drain.

In a further embodiment, another method of forming a vertical channel semiconductor structure comprises forming at least one dielectric layer in contact with sidewalls of at least one bottom source/drain layer and in contact with a top surface of at least one isolation layer. At least one metal layer is selectively formed on a top surface of the at least one bottom source/drain layer and a top surface of the at least one dielectric layer. At least one sacrificial spacer is formed on sidewalls of the at least one semiconductor fin formed on the at least one bottom source/drain layer. The metal layer is selectively removed exposing a bottom region of the at least one semiconductor fin. At least one inner/bottom spacer is formed on the exposed bottom region of the at least one semiconductor fin. At least one oxide layer is formed adjacent to and in contact with the at least one inner spacer, and is further formed on a top surface of an exposed portion of the at least one bottom source/drain layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1A:
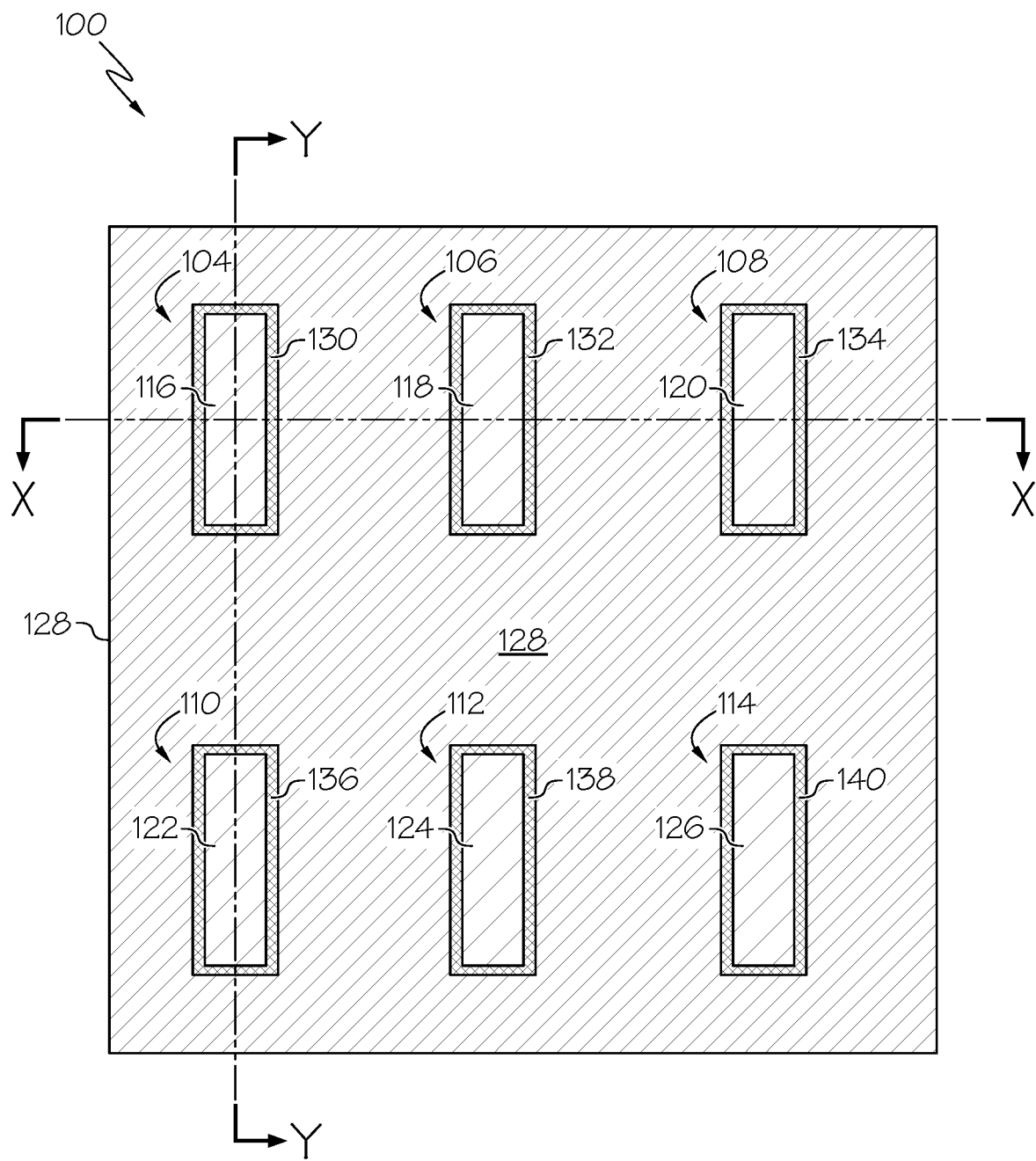
FIG. 1A is a top view of a semiconductor device structure after a plurality of fins have been formed on a substrate according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Vertical channel semiconductor devices such as vertical transport FETs (VTFETs) are being pursued as a viable CMOS architecture beyond the 7 nm node. A VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. In a typical VTFET fabrication flow, a bottom spacer may be formed on the bottom source/drain. One problem with current bottom spacer fabrication processes is that the resulting bottom spacer comprise various defects and feature-to-feature variations. In particular, forming VTFET bottom spacers usually requires a directional deposition process, which is not mature for mass production or requires complex integration solutions to enable directional deposition which could generate defects. As will be discussed in greater detail below, embodiments of the present invention overcome these problems by utilizing a replacement bottom spacer for VTFETs to improve the bottom spacer uniformity.

FIGS. 1A to 17 illustrate one or more processes for improving the uniformity of VTFET bottom spacers according to one or more embodiments of the present invention. In general, the figures may comprise a top view and various cross-sectional views that are taken where indicated in the top view. More specifically, some cross-sectional views such as those shown in FIG. 7 to FIG. 17 are taken along a line (X-line) that passes through the short axis of a plurality of fins; while some cross-sectional views such as those shown in FIG. 1B to FIG. 6 are taken along a line (Y-line) that passes through the long axis of a plurality of fins.

Figure 1B:
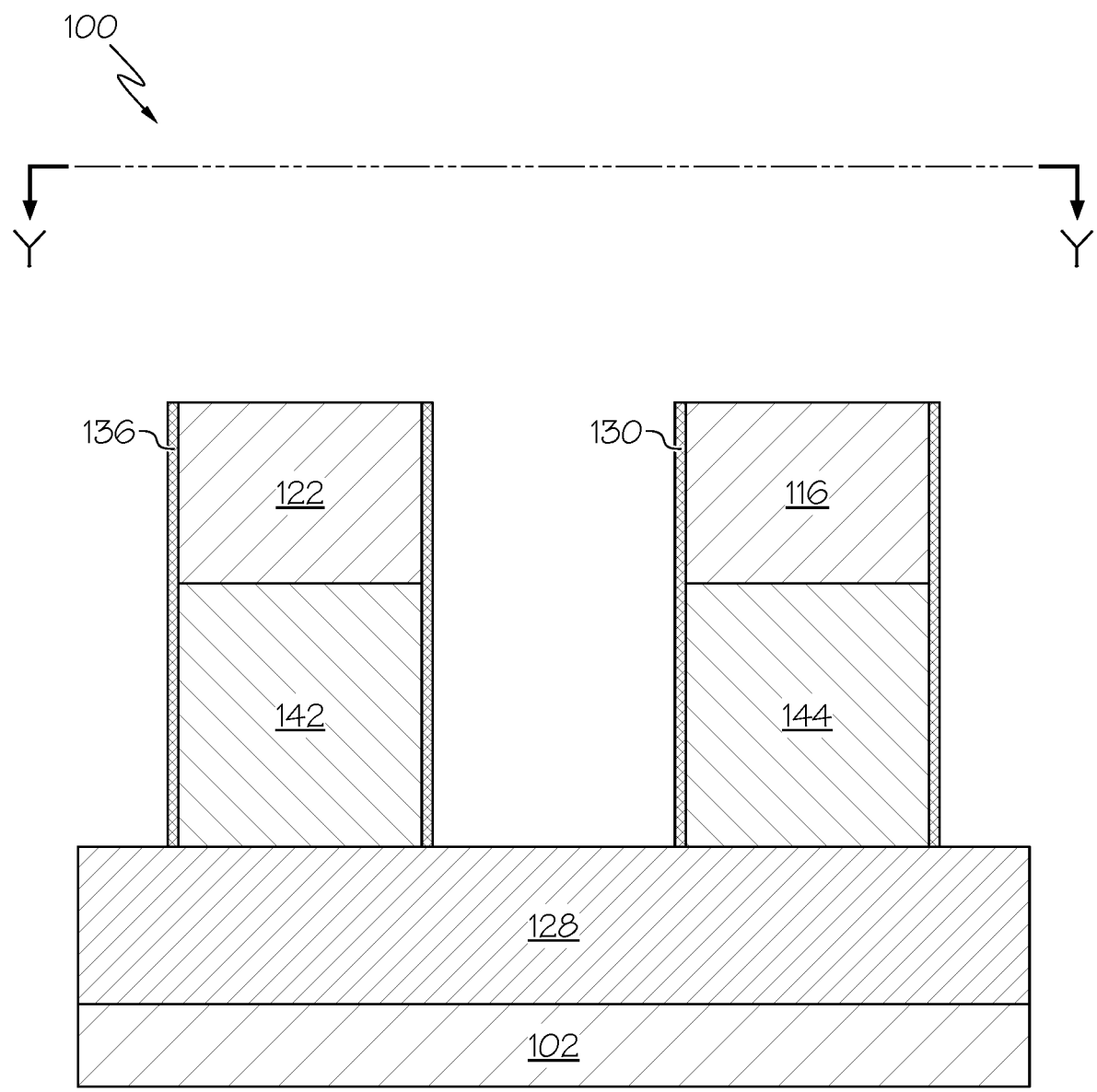
FIG. 1B is a cross-sectional view of the semiconductor device structure after the plurality of fins have been formed on the substrate according to one embodiment of the present invention.

FIGS. 1A and 1B show device structure 100 comprising a substrate 102, one or more semiconductor fin structures 104 to 114, and a bottom source/drain layer 128. In one embodiment, each semiconductor fin structure 104 to 114 comprises elements such as a hard mask 116 to 126; a semiconductor fin 142, 144, and an insulating liner/spacer 130 to 140. The hard mask 116 to 126, in one embodiment, is formed on and in contact with a top surface of each fin 142, 144 and the spacer 130 to 140 is formed on and in contact with sidewalls of each fin structure and hard mask 116 to 126. The device structure 100 may comprise fins 142, 144 for PFET devices, NFET devices, or a combination of both. In one embodiment, the substrate 102 may be comprised entirely of a semiconductor material. The substrate 102 may comprise a single crystalline semiconductor material or a polycrystalline material. In another embodiment, the substrate 102 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

The substrate 102 may comprise undoped single crystalline silicon or single crystalline silicon doped with p-type dopant atoms or n-type dopant atoms. Examples of materials for the substrate 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed. In other embodiments, the substrate 102 may be formed on and in contact with a handle substrate or an insulating layer disposed in contact with a handle substrate. In this embodiment, the handle substrate includes similar materials to those discussed above.

Doping of the substrate 102 (or other semiconductor layer from which the fins 144, 142 are formed) may be performed using, for example, ion implantation, or annealing if not using an epitaxial process. In a non-limiting illustrative example, the doping utilizes, for example, arsenic (As) or phosphorous (P) for n-type device, and boron (B) for a p-type device, at concentrations in the general range of, for example, $e20/cm^3$.

In other embodiments, the substrate 102 may be a silicon-on-insulator (SOI) substrate. In this example, an optional dielectric layer (e.g., a BOX layer or oxide layer) overlies the substrate, and the fins 142, 144 are formed on and in contact with the dielectric layer. The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick. In an embodiment where the fins structures are formed on an SOI substrate, the fin structures and the substrate can be made of the same or different materials.

In an SOI embodiment, the semiconductor material/layer from which the fins 142, 144 are fabricated may be formed utilizing various methods such as a layer transfer process including a bonding step, or an implantation process such as SIMOX (Separation by IMplantation of OXygen). This semiconductor material/layer may be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from 1×10E18 atoms/cm3 to 2×10E21 atoms/cm3. N-type transistors are produced by doping the semiconductor material/layer with elements from group V of the periodic table (e.g., phosphorus, antimony, or arsenic).

The semiconductor fins 142, 144 may be formed by forming an etch-stop hard mask onto the substrate 102 (or semiconductor layer) through, for example, deposition. The etch-stop hard mask may be made of, for example, silicon oxide, silicon oxynitride, silicon carbide, silicon oxycarbide, silicon nitride, titanium nitride, tetraethyl orthosilicate, a combination thereof, and/or other materials suitable in providing etch-stop function. The fins 142, 144 may be subsequently formed or etched out of the substrate 102 (or the semiconductor layer) through a process involving masking, using industry-standard lithographic techniques, and directionally etching (e.g., RIE) the etch-stop capping layer and underneath semiconductor layer (or substrate 102). After the RIE etching process, the photo-resist mask used in the lithographic etching process may be removed, leaving the fins 142, 144 and hard masks 116 to 126. In some embodiments, there may be different pitches between two or more of the fin structures to define different devices.

The substrate 102 may then be optionally recessed to form a bottom source/drain recess. The substrate 102 may be recessed using, for example, directional RIE. A lateral may also be performed to trim the fin bottom. The bottom source/drain layer 128 may then be formed. The bottom source/drain layer 128 may either be a source layer or a drain layer and formed in contact with the substrate layer 102 and a lower portion of the fins 142, 144. A single bottom source/drain layer 128 (merged) may be formed for multiple fins 142, 144 or a separate bottom source/drain layer 128 may be formed for each fin. Example materials for the bottom source/drain layer 128 include (but are not limited to) phosphorus doped silicon epitaxy for an nFET device and boron doped silicon germanium epitaxy for a pFET device.

In one embodiment, the bottom source/drain layer 128 may have a thickness of about 10 nm to about 100 nm. However, other thicknesses are applicable as well. The bottom source/drain layer 128 may be doped with dopant atoms. The dopant atoms may be an n-type dopant (i.e., an element from Group V of the Periodic Table of Elements) or a p-type dopant (i.e., an element from Group III of the Periodic Table of Elements). Examples of n-type dopants for a group IV semiconductor include phosphorus, arsenic and antimony. Examples of p-type dopants for a group IV semiconductor include boron, aluminum, and gallium. Examples of n-type dopants for a III-V semiconductor include selenium, tellurium, silicon, and germanium. Examples of p-type dopants for a III-V semiconductor include beryllium, zinc, cadmium, silicon, and germanium.

In some embodiments, the bottom source/drain layer 128 may be formed by epitaxial growth of a semiconductor material. The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

After the bottom source/drain layer 128 has been formed, an anneal may be performed to drive the dopant in the bottom source/drain into the fins 142, 144. A thermal anneal process such as laser anneal, flash anneal, rapid thermal anneal (RTA), furnace anneal, or any suitable combination of those annealing techniques may be performed. This process forms a first doped fin region in a portion of the fins 142, 144 laterally contacted by the bottom source/drain layer 128. It should be noted that the anneal may be performed at a subsequent point in the fabrication process. The dopant concentration of the bottom source/drain layer 128 may be from $1 \times 10^{20}$ atoms/cm3 to $1 \times 9^{22}$ atoms/cm3, although lesser and greater dopant concentrations may also be employed.

The spacers 130 to 140 may then be formed on the sidewalls of the fins 104 to 114 and the hard masks 116 to 126. The spacers 130 to 140 may be formed by one or more spacer formation techniques. For example, the spacers 130 to 140 may be formed by conformally depositing a conformal layer of insulating material (e.g., silicon oxide, silicon oxycarbide, silicon oxycarbonitride, some other oxide, and the like) followed by an anisotropic etch (e.g., reactive ion etch (RIE)) of that material to form the spacers 130 to 140 only on the sidewalls of the fins 142, 144 and hard marks 116 to 126.

Figure 2:
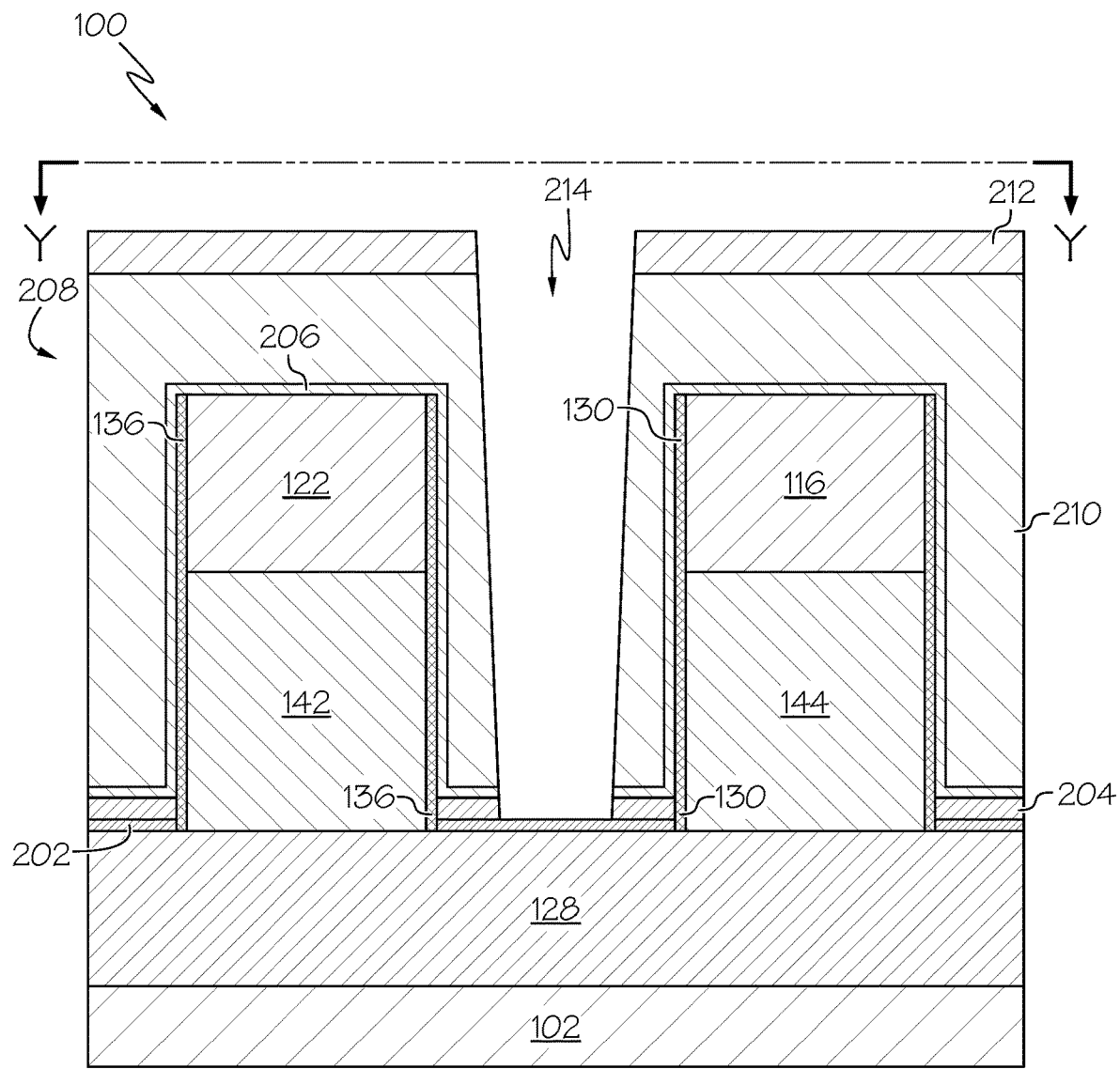
FIG. 2 is cross-sectional view of the semiconductor device structure after an epi cap layer, sacrificial layer, optional support layer, patterning stack, and trench have been formed according to one embodiment of the present invention.

FIG. 2 shows that an epi cap layer 202 may formed on and in contact with a top surface of the bottom source/drain layer 128 and a portion of the sidewalls of the spacer layers 130 to 140. The epi cap layer 202 may be formed by selectively growing a thin epitaxy layer over the bottom source/drain 128. The epi cap layer 202 may include, for example, silicon. The epi cap layer 202 may comprise a thickness of 1-3 nm, although lesser and greater thicknesses are applicable as well FIG. 2 further shows that a sacrificial layer 204 may be epitaxially formed on a top surface of the epi cap layer 202 and a portion of the sidewalls of the spacer layers 130 to 140. The sacrificial layer 204 may comprise silicon germanium, germanium, and/or the like and may comprise a thickness of 3-8 nm, although lesser and greater thicknesses are applicable as well. It should be noted that, in some embodiments, the profile of the bottom portion of the fins 142, 144 may not be straight. In these embodiments, the sacrificial layer 204 may have a faceted shape near the spacers 130 to 140.

A supporting layer 206 may then be conformally formed over the structure 100 using one or more conformal deposition methods. The supporting layer 206 may comprise silicon dioxide, amorphous silicon, and/or the like. In some embodiments, the supporting layer 206 is optional and is not formed. After the first and second sacrificial (epi cap) layers 202, 204 have been formed or after the optional supporting layer 206 has been formed a patterning stack 208 may be formed over the structure 100. The patterning stack 208 may be a tri-layer stack, quad-layer stack, or any other applicable patterning stack configuration. In the example shown in FIG. 2, the patterning stack 208 may comprise an organic planarization layer (OPL) 210, an anti-reflective coating (ARC) 212, and a photoresist layer (not shown). The OPL 210 may include a material(s) such as spin-on carbon (SOC), diamond-like carbon, polyarylene ether, polyimide, polymethyl methacrylate, polymethyl isopropenyl ketone, photoresists, and/or the like. The OPL 210 may be formed utilizing any conventional deposition process including, for example, CVD, PVD, plasma enhanced chemical vapor deposition (PECVD), evaporation, spin coating, and dip coating. Chemical mechanical planarization (CMP) and/or grinding may be used to planarize the deposited OPL.

The ARC layer 212 may comprise a silicon-ARC, titanium-ARC, and/or the like. The ARC layer 212 may be formed by, for example, one or more processes including sputtering, evaporation, CVD, PVD, ALD, and/or the like. The photoresist layer may comprise a material that is sensitive to one or more types of patterning processes such extreme ultraviolet (EUV) light patterning and/or the like. The photoresist layer may be deposited using one or more processes such as spin-on coating, CVD, PVD, ALD, and/or the like.

The photoresist layer may be patterned using any suitable photolithography technique. For example, in on embodiment, a photomask is disposed over the photoresist layer. The photoresist layer may then be exposed to a radiation beam, and then hardened via a curing or baking process. Unexposed or exposed portions of the photoresist layer may then be removed using a developer. The foregoing process results in the desired pattern. The pattern includes portions of the photoresist layer in contact with ARC layer 212 while other portions of the ARC layer 212 remain exposed. In some embodiments, the portions of the photoresist layer may be trimmed using, for example, an anisotropic plasma etch process.

After the photoresist layer has been patterned, the pattern is transferred down to the sacrificial layer 204. For example, a selective etching process may be used to first transfer the pattern to the ARC layer 212. A separate selective etching process may then be used to transfer the pattern to the OPL 210. Alternatively, the ARC layer 212 and the OPL 210 may be etched using a single etching process. One or more etching processes may then be used to transfer the pattern down to sacrificial layer 204. The etching process etches through the optional support layer 206 if formed and stops at the top surface (or partially below the top surface) of the sacrificial layer 204 thereby forming a trench 214.

Figure 3:
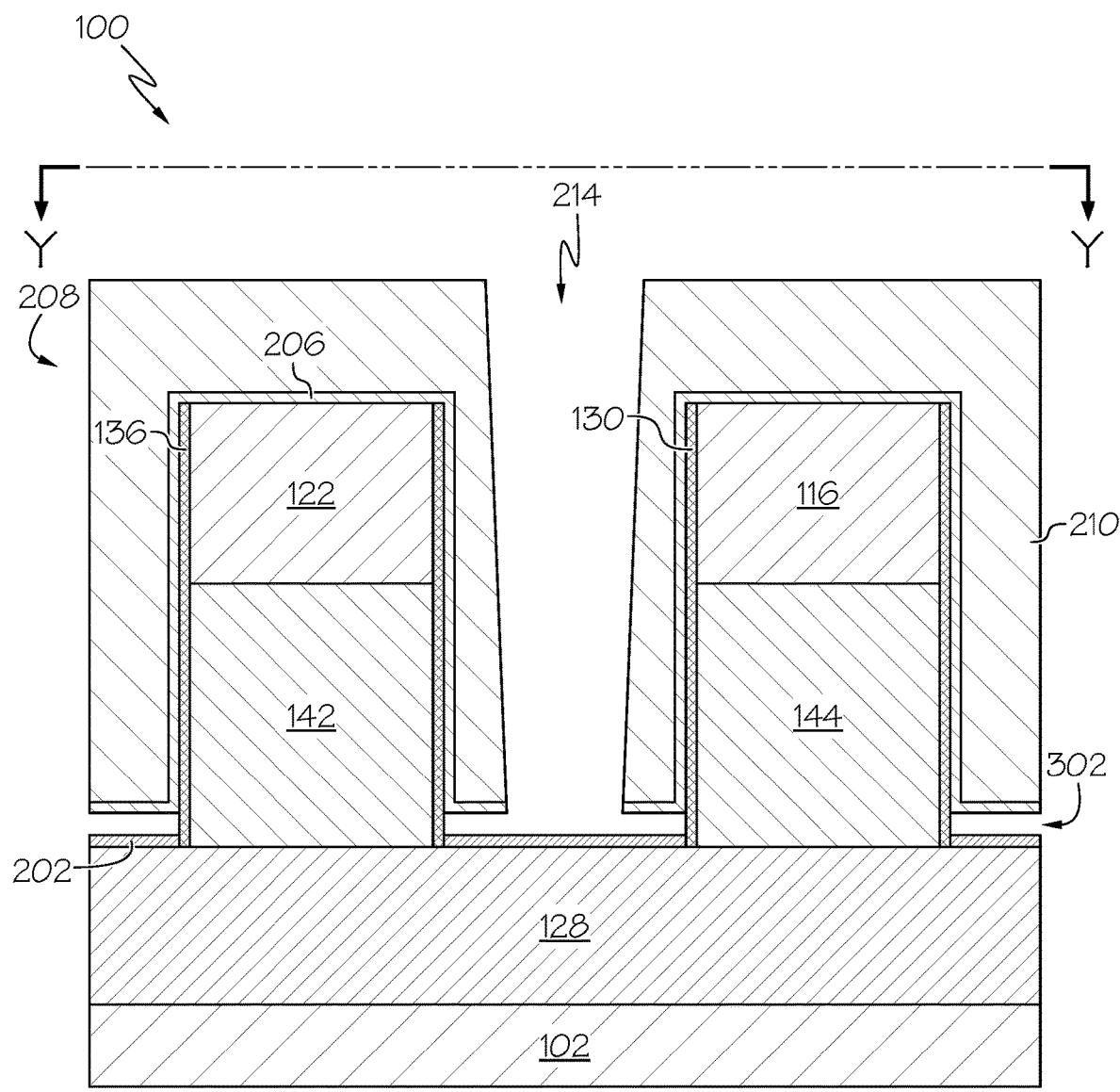
FIG. 3 is a cross-sectional view of the semiconductor device structure after a lateral etch has been performed to remove the sacrificial layer according to one embodiment of the present invention.

FIG. 3 shows that the sacrificial layer 204 may then be removed using, for example, an isotropic etch (e.g., wet chemical etch, dry plasma etch, gas phase etch, etc.), where the isotropic etch selectively etches laterally into the sacrificial layer 204. This process forms a lateral cavity 302 between the epi cap layer 202 and a bottom surface of the OPL 210 or support layer 206 if formed. The support layer 206 supports the OPL 210 and helps prevent the OPL 210 from changing its shape after the sacrificial layer 204 has been removed. Any remaining photoresist layer and ARC layer 212 may then be removed by, for example, reactive ion etches (RIE).

Figure 4:
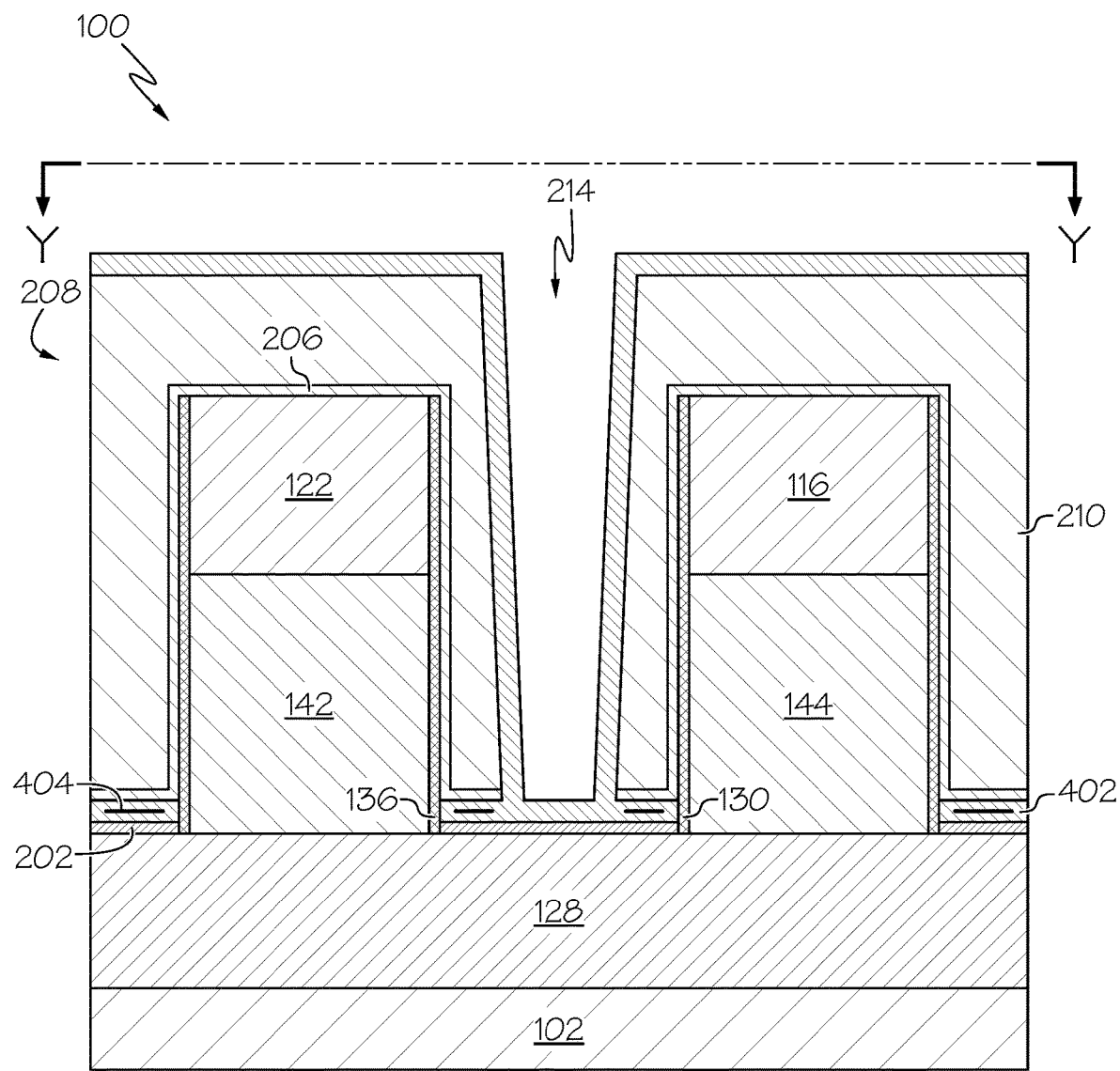
FIG. 4 is a cross-sectional view of the semiconductor device structure after a bottom spacer has been formed within the sacrificial layer cavity according to one embodiment of the present invention.

Replacement bottom spacer material may then be deposited in the cavity 302 to form a replacement bottom spacer 402, as shown in FIG. 4. For example, replacement bottom spacer material may include an insulating material such as silicon oxide, silicon nitride, silicon oxynitride, and/or the like. The replacement bottom spacer material may be deposited using, for example, using a conformal deposition process such as ALD, plasma enhanced ALD, CVD, plasma enhanced CVD, and/or the like. In some embodiments, a seam 404 (e.g., an air gap) is formed in the replacement bottom spacer 402 as a result of the deposition method.

Figure 5:
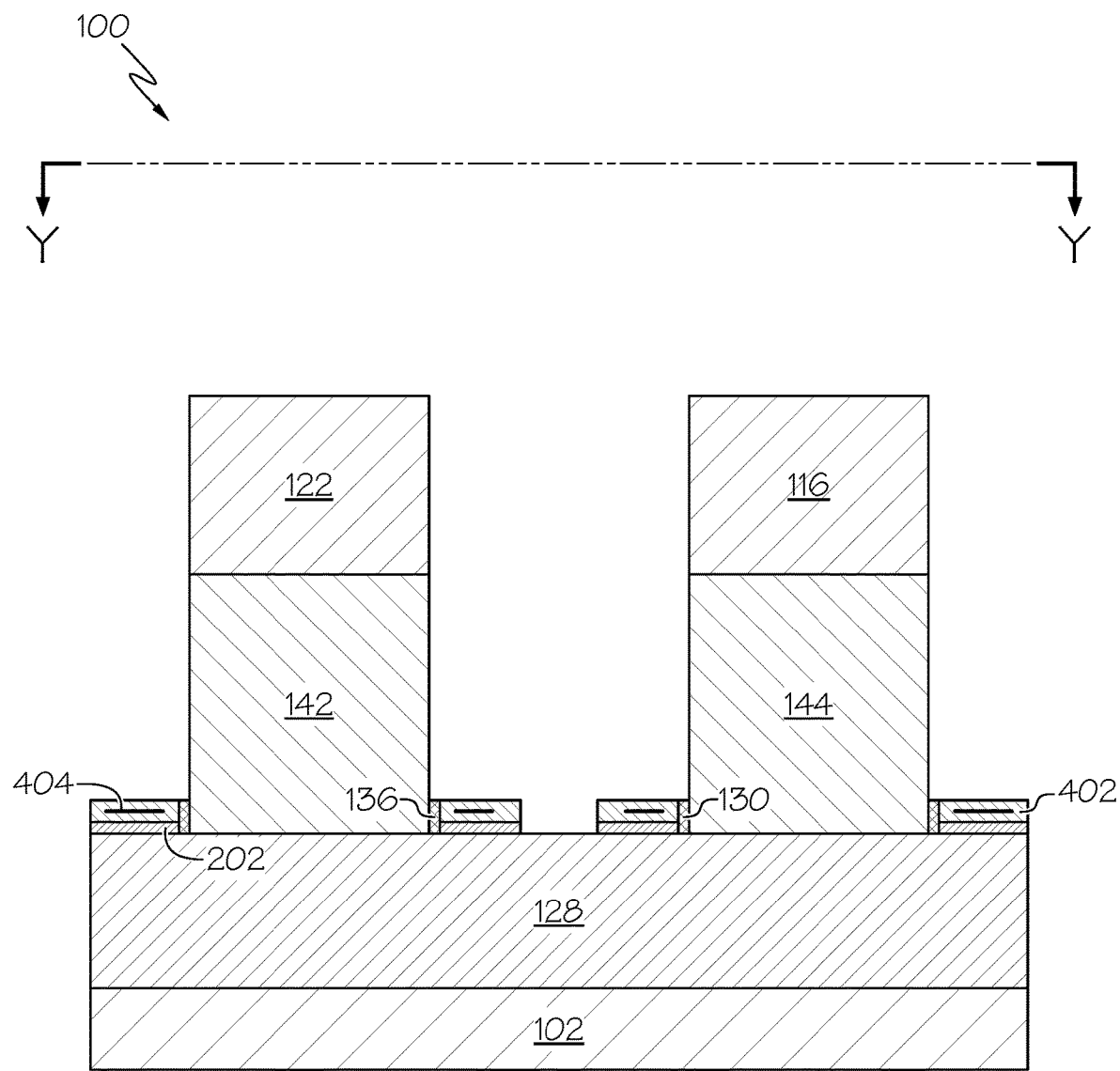
FIG. 5 is a cross-sectional view of the semiconductor device structure after the optional support layer, and patterning stack have been removed and a fin spacer/liner has been etched according to one embodiment of the present invention.

After the replacement bottom spacer 402 has been formed, excess replacement bottom spacer material may be removed using, for example, an isotropic etching process as shown in FIG. 5. FIG. 5 further shows that the OPL 210 and support layer 206 may be removed and the spacers 130 to 140 selectively etched down to a top surface of the replacement bottom spacers 402. The OPL 210 may be removed using, for example, an ashing process and the support layer 206 may be removed using one or more selective etching processes.

Figure 6:
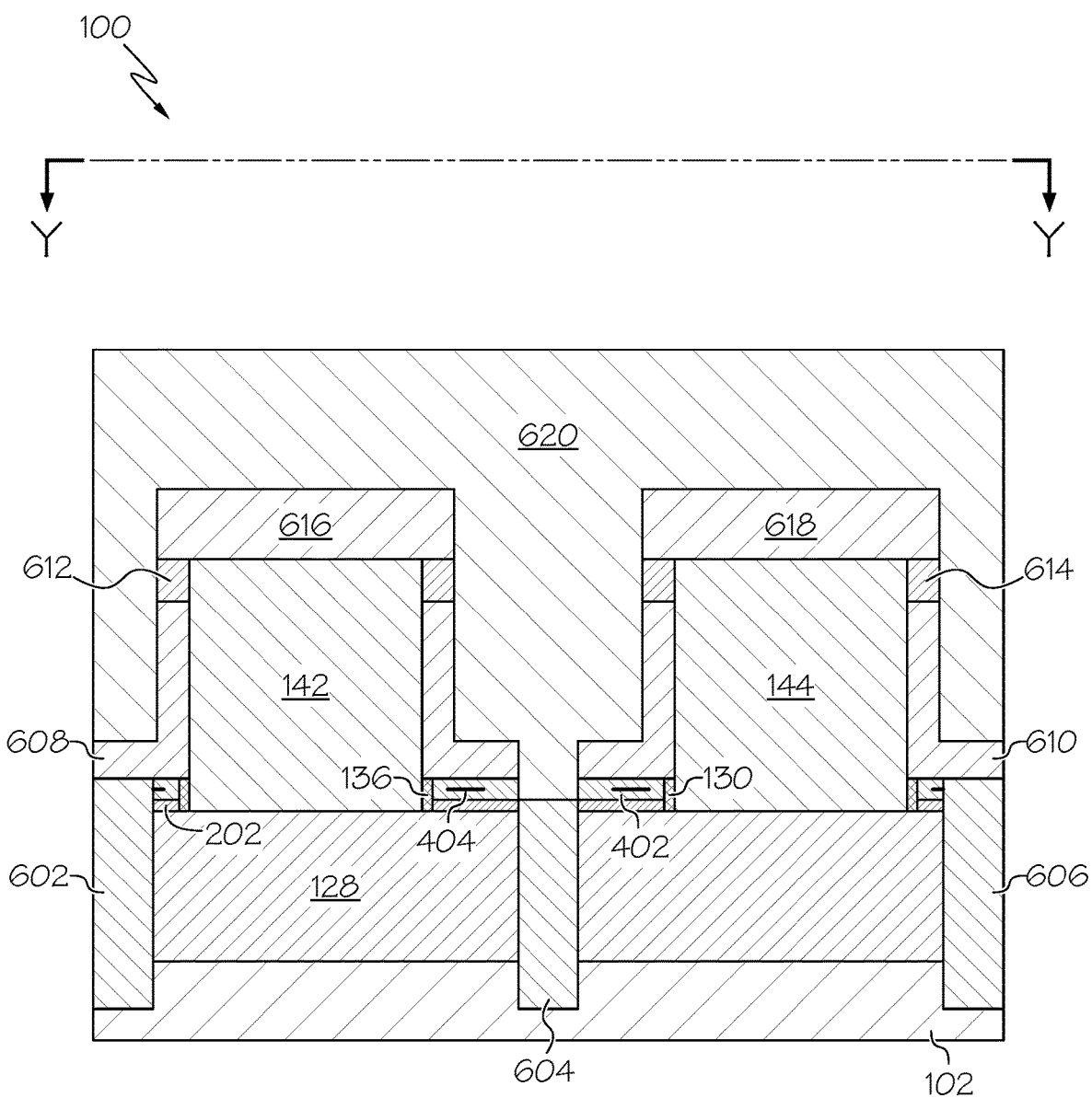
FIG. 6 is a cross-sectional view of the semiconductor device structure after a gate structure, top spacer layer, and top source/drain layer have been formed according to one embodiment of the present invention.

Additional fabrication processes may then be performed to complete the VTFET structure. For example, FIG. 6 shows isolation regions 602 to 606 may be formed between separate devices. The isolation regions 602 to 606 may be formed by depositing an OPL and patterning the OPL. This patterning process forms isolation trenches by etching exposed portions of the replacement bottom spacer 402, underlying portions of the epi cap layer 202, underlying portions of the bottom source/drain layer 128, and underlying portions of the substrate 102. A dielectric material (e.g. SiO2, or a thin liner of SiN followed by SiO2 fill) may be formed/deposited over the entire structure 100 and within the isolation trenches. The dielectric material may be a flowable oxide or another type of oxide. The dielectric material may be overfilled and then polished/etched back such that a top surface of the dielectric material is planar with a top surface of the replacement bottom spacer 402. In some embodiments, there may be non-uniformity across the dielectric material such that the top surfaces of one or more isolation regions 602 to 606 is above or below a top surface of another one or more of the isolation regions 602 to 606.

One or more gate structures 608, 610; top spacer layers 612, 614; and top source/drain layers 616, 618 may be formed. The one or more gate structures 608, 610 may be formed by first forming an insulating layer on and in contact with and surrounding a portion of the fin sidewalls; a top surface of portions of the replacement bottom spacer layer 402; a top surface of the etched spacers 130 to 140; and a top surface of the isolation layers 602 to 606. The insulating layer may be formed by depositing a thin conformal layer over the structure by, for example, CVD, PECVD, or ALD and then performing an etch to remove the insulating material from portions of the structure.

In one embodiment, the insulating layer may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer may further include dopants such as lanthanum or aluminum.

After formation of the insulating layer, an annealing process may be performed to form bottom source/drain junctions within a portion of the fins 104 to 114. In one or more embodiments, an 128 in order to push the bottom junctions further into the fins 104 to 114. A thermal anneal process such as laser anneal, flash anneal, rapid thermal anneal (RTA), furnace anneal, or any suitable combination of those annealing techniques may be performed.

One or more or more conductive gate layers may then be formed in contact with and surrounding the vertical sidewalls of the insulating layer, and may also be in contact with a top surface of the insulating layer that are in contact with the replacement bottom spacer layer 402, etched spacer layers 130 to 140, and isolation regions 602 to 606. In one embodiment, the conductive gate layers may be formed by depositing one or more conductive materials over the structure. An isotropic etch may be performed to recess the gate structure, including the insulating layer and conductive gate layers. The insulating layer and conductive gate layers form a gate structure. A single gate structure may be formed for multiple fins, or separate gate structures may be formed for each of the multiple fins. If the structure comprises both PFET and NFET devices, PFET conductive materials may first be deposited. The PFET device may then masked off and one or more NFET conductive materials are deposited over the entire structure. The masking layer is then removed from the PFET device. In other embodiments, the NFET device may be masked off during deposition of the PFET gate layers.

Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

The conductive gate material may comprise multiple layers such as gate work function setting layer (work function metal) and/or a conductive gate layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack.

The top spacer layers 612, 614 may be formed on and in contact with the top surface of the conductive gate layers and insulating layers of the gate structure(s) 608, 610, and may further be formed in contact with a portion of the fin structure sidewalls. The top surface of the top spacer layers 612, 614 may be co-planar with the top surfaces of the fins 142, 144. In one embodiment, the spacer layers 612, 614 may comprise the same or different material as the epi cap layer 202. For example, the top spacers 612, 614 may comprise an insulating material (such as silicon, silicon oxide, silicon nitride, silicon oxynitride, and/or the like) and may be formed using any conventional deposition process such as, for example, chemical vapor deposition (CVD) and subsequent etching techniques. The deposited spacer material may be subsequently etched to form the final spacer structure.

A dielectric layer (shown as part of layer 620) may then be formed on the structure 100. The dielectric layer, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Planarization, for example, CMP can be performed to remove excess material from the dielectric layer. The planarization can be performed down to the hard masks 116 to 126.

The hard masks 116 to 126 may be selectively removed by, for example, RIE which stops on the fins 142, 144. The top source/drains layers 616, 618 may then be formed in contact with at least the exposed portions of the fins 142, 144, which may have source/drain junctions formed therein. The top source/drains 616, 618 may be formed using an epitaxy process. For example, selective epitaxy may be used to grow material from the exposed portions of the fins 142, 144 to form the top source/drain layers 616, 618. The top source/drain layers 616, 618 may either be a source layer or a drain layer and may comprise in-situ doping (boron, in one embodiment for PFET and phosphorus, in one embodiment, for NFET).

It should be noted that, according to one embodiment, the top source/drain layers 616, 618 may not contain any doping. Doping may be performed using any standard approach such as ion implantation. In particular, due to the slower growth rates on (111) orientated surface during the epitaxial growth so that faceted top source/drain layers 616, 618 are obtained. In some embodiments, the top/source drain layers 616, 618 may comprise a diamond shape. The epitaxial growth of diamond shaped epitaxy is self-limiting to the outer <111> plane resulting in diamond outer periphery. It should be noted that, non-faceted epitaxy and/or multiple epitaxy steps can be used to form the top source/drain layers 616, 618 without limiting the scope of the present invention. It should also be noted that, in some embodiments, the top/source drain layers 616, 618 may be merged.

In one or more embodiments, an annealing process may be conducted after the formation of the top source/drain layer 616, 618 in order to push any formed top junctions further into the fins 142, 144. A thermal anneal process such as laser anneal, flash anneal, rapid thermal anneal (RTA), furnace anneal, or any suitable combination of those annealing techniques can be performed. In some embodiments.

An additional dielectric 620 may then be formed over the entire structure. The dielectric layer 620, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable. Further processing may then be performed to form one or more contacts (not shown).

The resulting structure 100, in one embodiment, comprises one or more bottom spacers 402 comprising an inner portion between pairs of semiconductor fins (e.g., 142, 144) of the plurality of semiconductor fins, and further comprising an outer portion adjacent to a device isolation region (e.g., 604). A seam 404 of the one or more seams within the inner portion of the at least one bottom spacer 402 may enclosed by a dielectric liner (e.g. spacers 130 to 140), where a seam 404 of the one or more seams within the outer portion of the at least one bottom spacer 402 may be exposed to an interlayer dielectric (e.g., 620).

Figure 7:
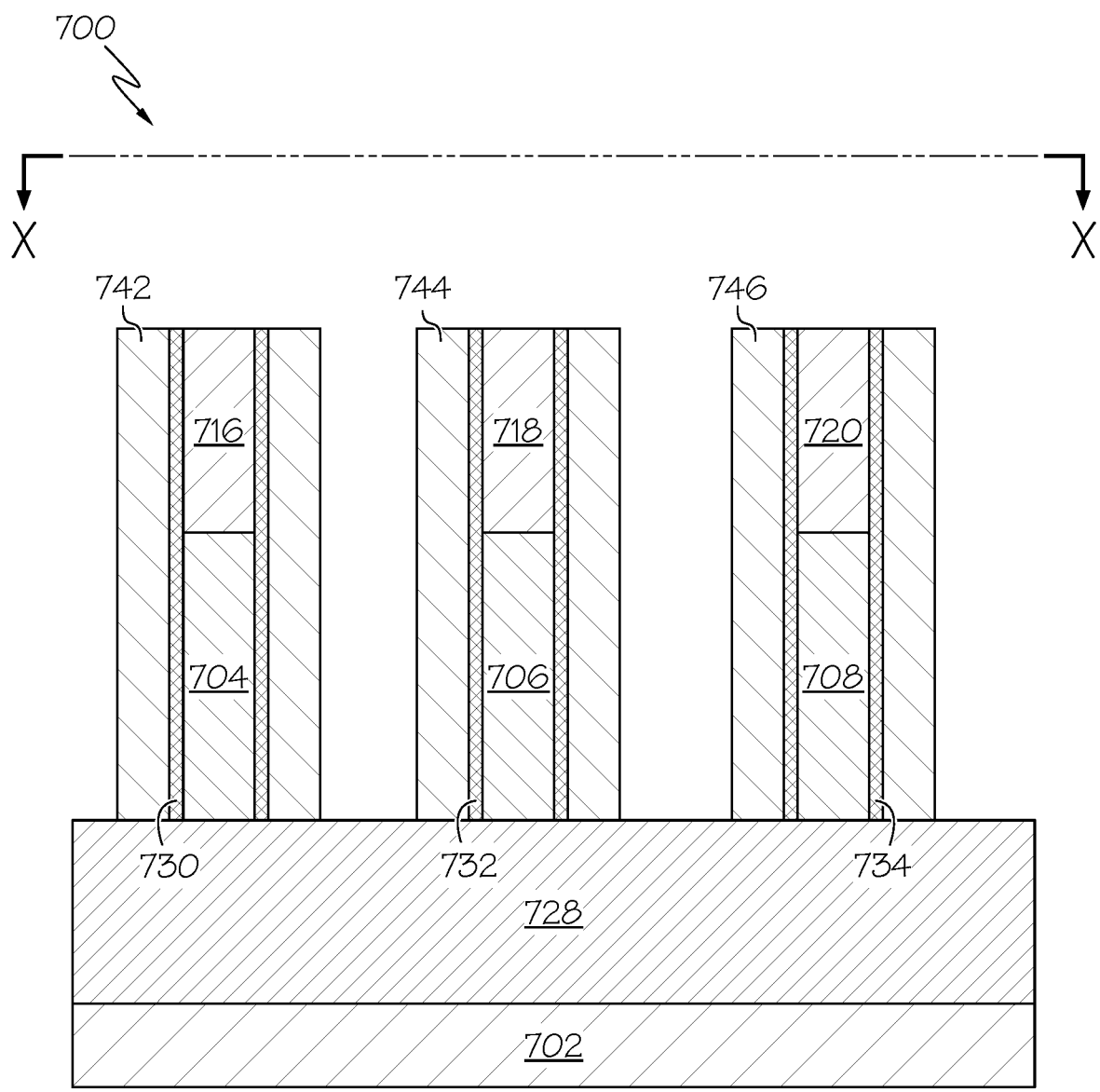
FIG. 7 is a cross-sectional view of a semiconductor device structure after a plurality of fins have been formed on a substrate according to another embodiment of the present invention.

FIGS. 7 to 12 illustrate one or more processes for improving the uniformity of VTFET bottom spacers according to another embodiment of the present invention. FIG. 7 shows a semiconductor device structure 700 at a given point in the fabrication process. For example, FIG. 7 shows a substrate 702; one or more semiconductor fin structures 704 to 708; a hard mask 716 to 720 formed on and in contact with a top surface of each fin 704 to 708; a bottom source/drain layer 828; an insulating liner 730 to 734 in contact with each fin structure 704 to 708 and hard mask 116 to 120; and a spacer 742 to 746 formed on and in contact with the top surface of the bottom source/drain layer 828 and sidewalls of the liners 730 to 734. The substrate 702; fin structures 704 to 708; hard masks 716 to 720; bottom source/drain layer 828; and liners 730 to 734 are similar to the features discussed above with respect to FIG. 6. The spacers 742 to 746 may comprise an insulating material such as silicon oxycarbide or other applicable material and may be formed using one or more spacer formation techniques.

Figure 8:
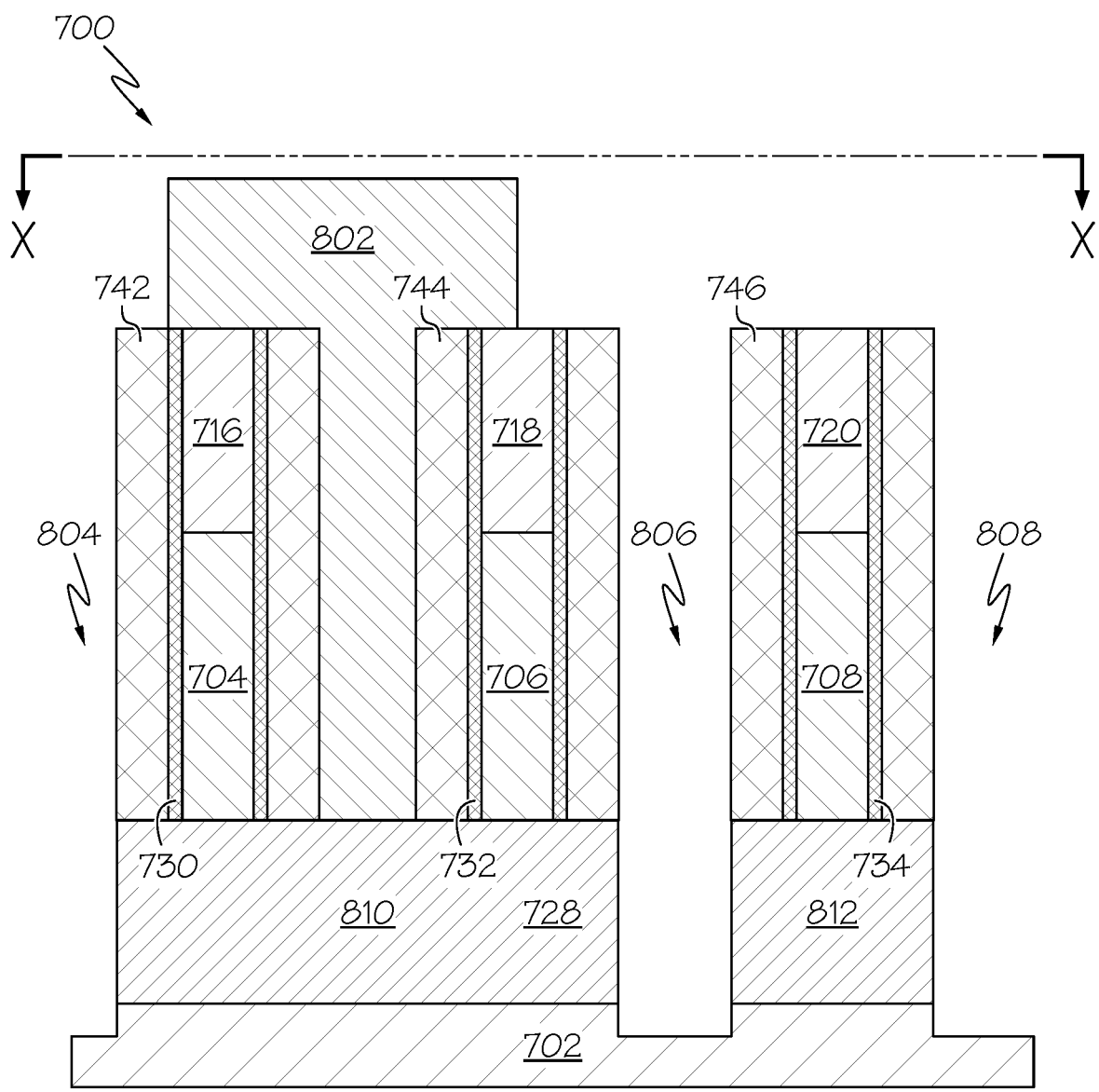
FIG. 8 is a cross-sectional view of the semiconductor device structure after active region patterning has been performed according to another embodiment of the present invention.

FIG. 8 shows that an OPL 802 may be formed over portions of the structure 700. The OPL 802 may be formed over the structure 700 using known organic materials and techniques. For example, the OPL 802 may comprise a resin material that is applied by spin coating and baked to enhance planarization. In some embodiments, the OPL 802 may comprise a liquid monomer that is applied by spin coating and photochemically hardened. The OPL 802 may be patterned using lithographic techniques. In some embodiments, the OPL 802 may be patterned to form an active area etch mask over some portions of the structure but not on other portions of the structure 700. In one or more embodiments, the OPL 802 may be patterned into shapes that are transferred to the substrate 702.

After the OPL 802 has been patterned, a self-aligned active area patterning process may be performed. This patterning process forms isolation trenches 804 to 808 by etching the exposed portions of the bottom source/drain layer 728 and at least a portion of the underlying region of the substrate 702. The patterning process also may pattern the bottom source/drain layer 728 into a plurality of bottom source/drain layers 810, 812 each in contact with at least one of the fin structures. The etching process may be selective to the OPL 802; spacers 742 to 746; and hard masks 716 to 720.

Figure 9:
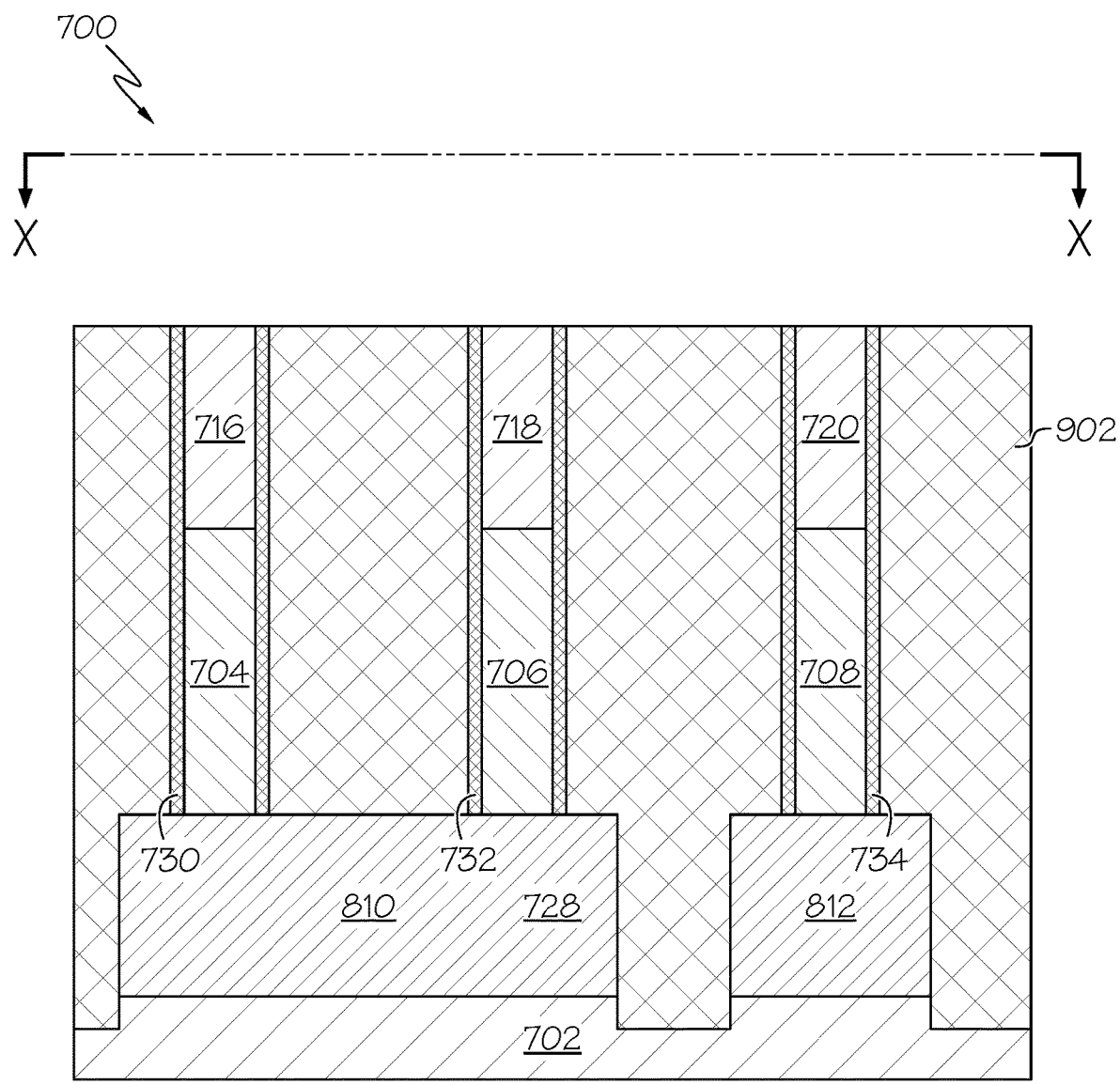
FIG. 9 is a cross-sectional view of the semiconductor device structure after an oxide material has been deposited over the structure according to another embodiment of the present invention.
Figure 10:
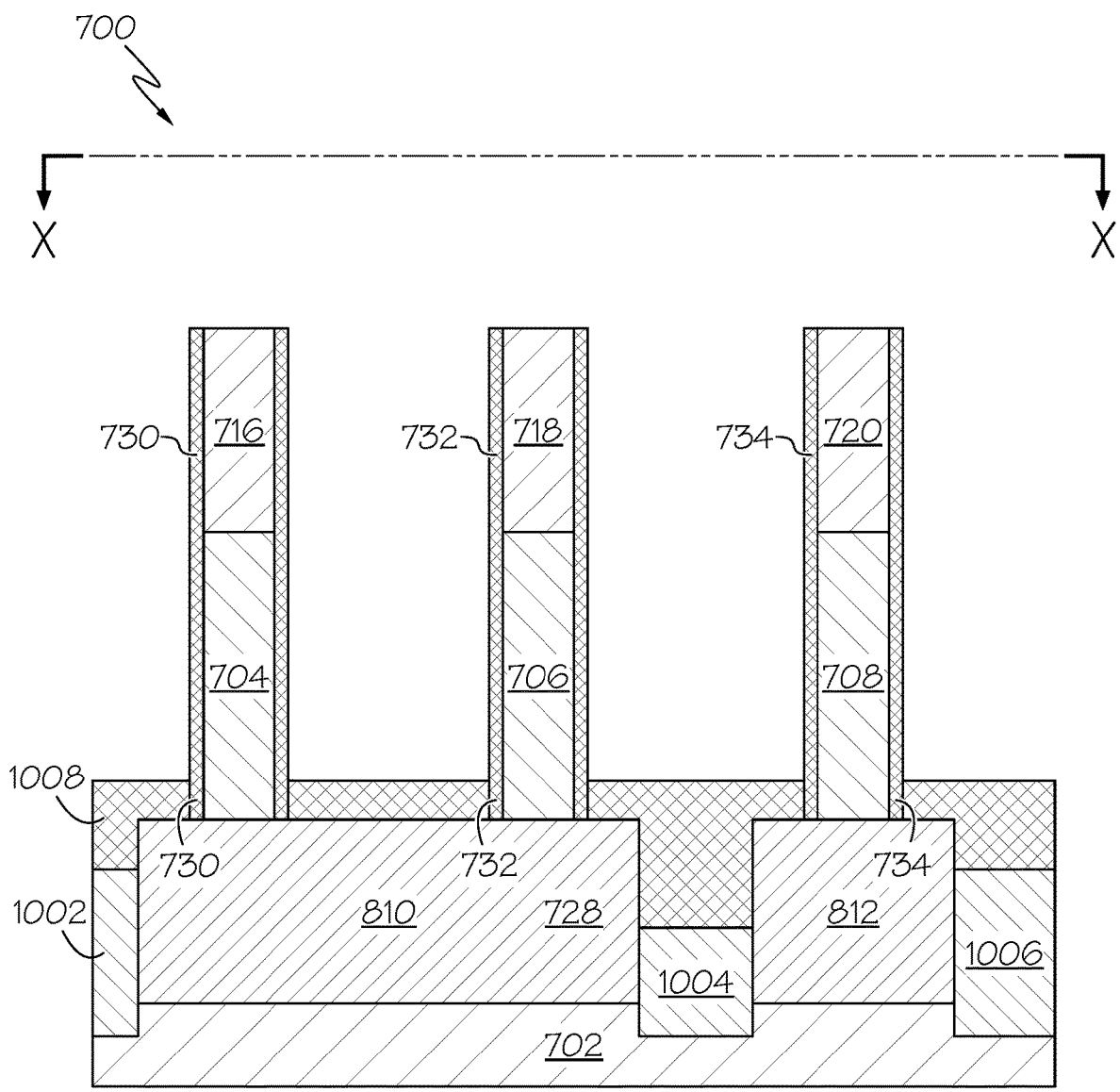
FIG. 10 is a cross-sectional view of the semiconductor device structure after isolation regions and a selective metal layer have been formed according to another embodiment of the present invention.

FIG. 9 shows that after the isolation trenches 804 to 808 have been formed, the OPL 802 may then be removed by, for example, an ashing process. After the OPL 802 has been removed a dielectric/oxide material 902 (e.g. SiO2, or a thin liner of SiN followed by SiO2 fill) may be formed/deposited over the entire structure 100 and within the trenches 804 to 808. The oxide material 902 may be a flowable oxide or another type of oxide. The oxide material 902 may be overfilled then the spacers 742 to 746 and the oxide material may be polished back as shown in FIG. 10. A fin reveal process may then be performed to etch away the spacers 742 to 746 and etch the oxide 902 below a top surface of the bottom source/drain layers 810, 812 to form isolation regions 1002 to 1006 comprising the oxide material. The fin reveal process may be performed using, for example, RIE, an isotropic process, a wet etch, and/or the like. In some embodiments, there may be non-uniformity across the oxide material forming the isolation regions 1002 to 1006 as shown in FIG. 10. The non-uniformity may be caused etch loading effect since the density and layout of the devices may be different from region to region. The different densities and layouts may result in different amounts of etch loading resulting in the non-uniformity in the oxide reveal.

FIG. 10 further shows a selective metal layer 1008 may be formed on and in contact with the top surface of the isolation regions 1002 to 1006; exposed portions of the top surface of the bottom source/drain layers 810, 812; and a bottom portion of the sidewalls of the liners 730 to 734. The selective metal layer 1008 may be formed using a conformal and selective metal growth process such as CVD. In some embodiments, the selective metal layer 908 comprises titanium but other metals are applicable as well. The selective metal layer 1008 may pinch-off the isolation regions 1002 to 1006.

Figure 11:
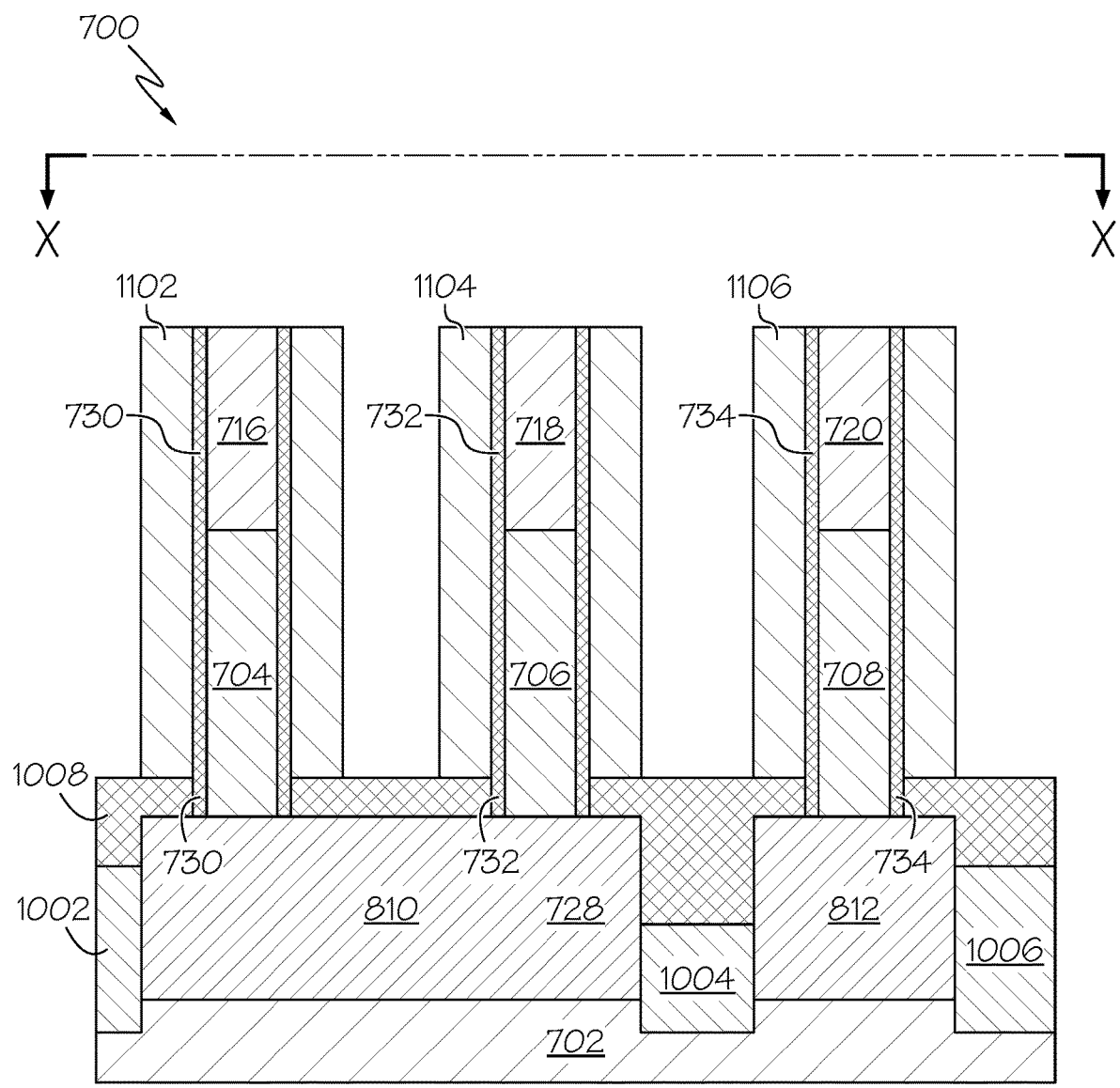
FIG. 11 is a cross-sectional view of the semiconductor device structure after sacrificial spacers have been formed according to another embodiment of the present invention.

Sacrificial spacers 1102 to 1106 may be then formed on and in contact with a top surface of the selective metal layer 1008 and sidewalls of the liners 730 to 734 as shown in FIG. 11. The sacrificial spacers 1102 to 1106 may comprise amorphous silicon or another applicable spacer material and may be formed using one or more spacer formation techniques. For example, a layer of insulating material may for conformally formed followed by an anisotropic etch (e.g., reactive ion etch (RIE)) of that material to form the sacrificial spacers 1102 to 1106 only on the sidewalls of the fin structures liners 730 to 734.

Figure 12:
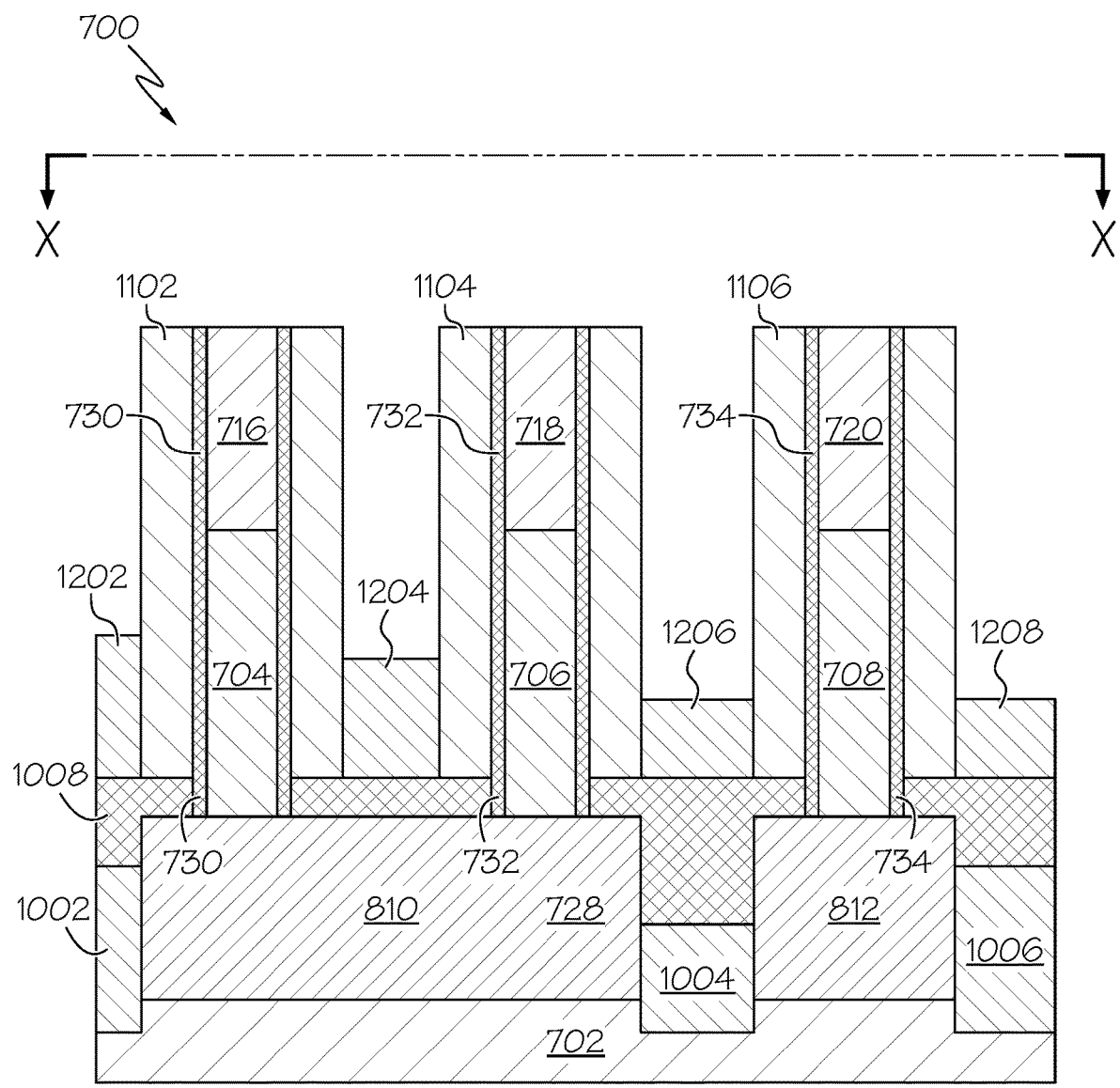
FIG. 12 is a cross-sectional view of the semiconductor device structure after oxide layers have been formed adjacent to the sacrificial spacers, according to another embodiment of the present invention.

FIG. 12 shows that oxide layers 1202 to 1208 may be formed/deposited on and in contact with any exposed portions of the top surface of the selective metal layer 908 and a portion of the sidewalls of the sacrificial spacers 1102 to 1106. For example, a directional deposition process such as high density plasma (HDP) or GCIB may be used to form the oxide layers 1202 to 1208. Since HDP is directional more oxide material is deposited on the bottom horizontal regions of the structure than the vertical sidewalls of the structure. Therefore, an isotropic oxide removal process such as BHF wet etch may then be used to remove any oxide residual at sidewall. For example, the directional deposition may deposit materials with a faster rate at surfaces having certain sizes of flat regions and may deposit materials with a slower deposition rate at vertical sidewall or small corners. Therefore, portions of the oxide layer which has less deposition amount (e.g., over top of the fin, or over the short active extension) may be completely removed after BHF wet oxide etch. In some embodiments, oxide layers 1202 to 1208 may have variations with respect to each other. The non-uniformity may be caused etch loading effect since the density and layout of the devices may be different from region to region. The different densities and layouts may result in different amounts of etch loading resulting in the non-uniformity in the oxide layers 1202 to 1208.

Figure 13:
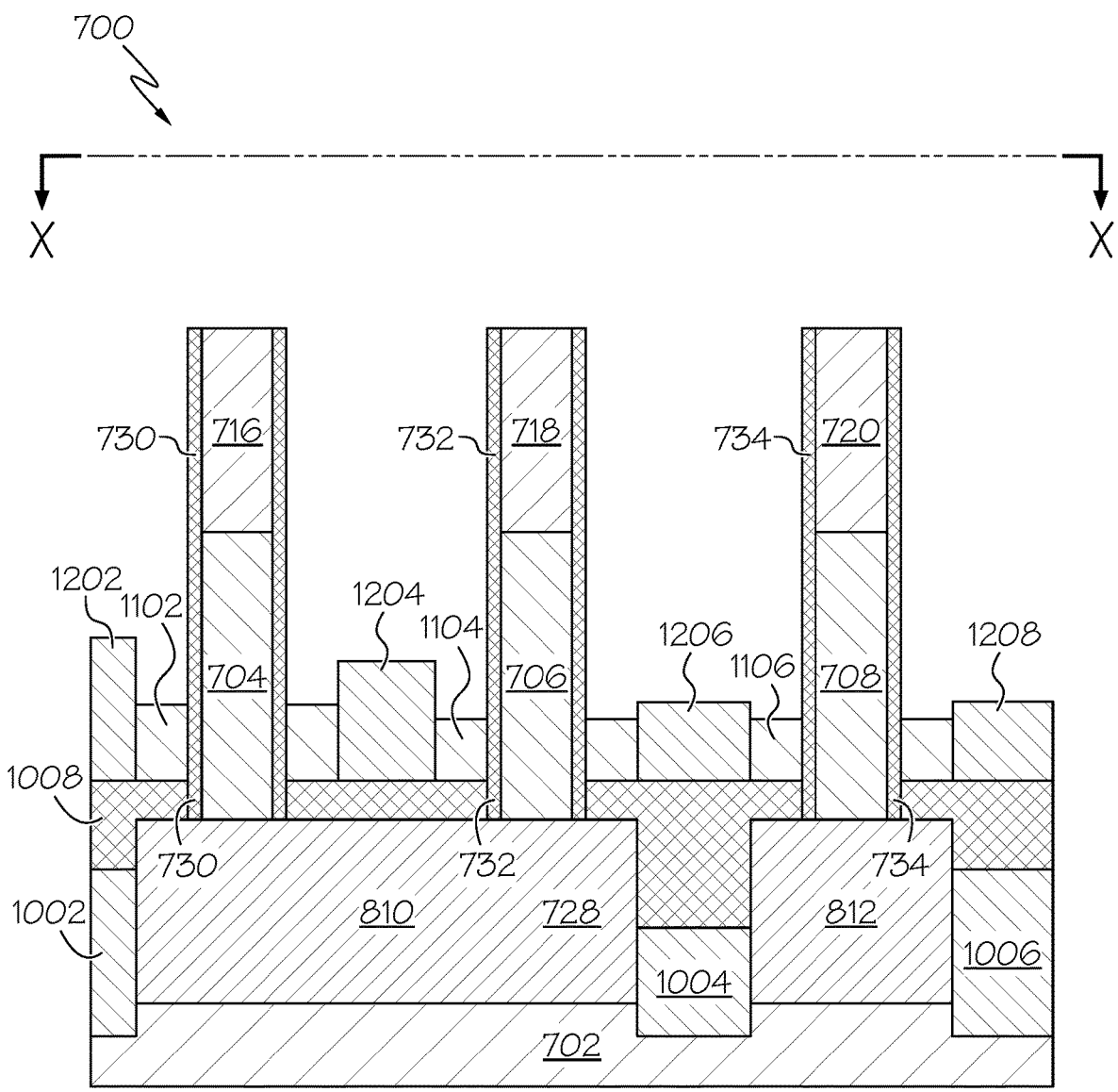
FIG. 13 is a cross-sectional view of the semiconductor device structure after the sacrificial spacers have been recessed, according to another embodiment of the present invention.
Figure 14:
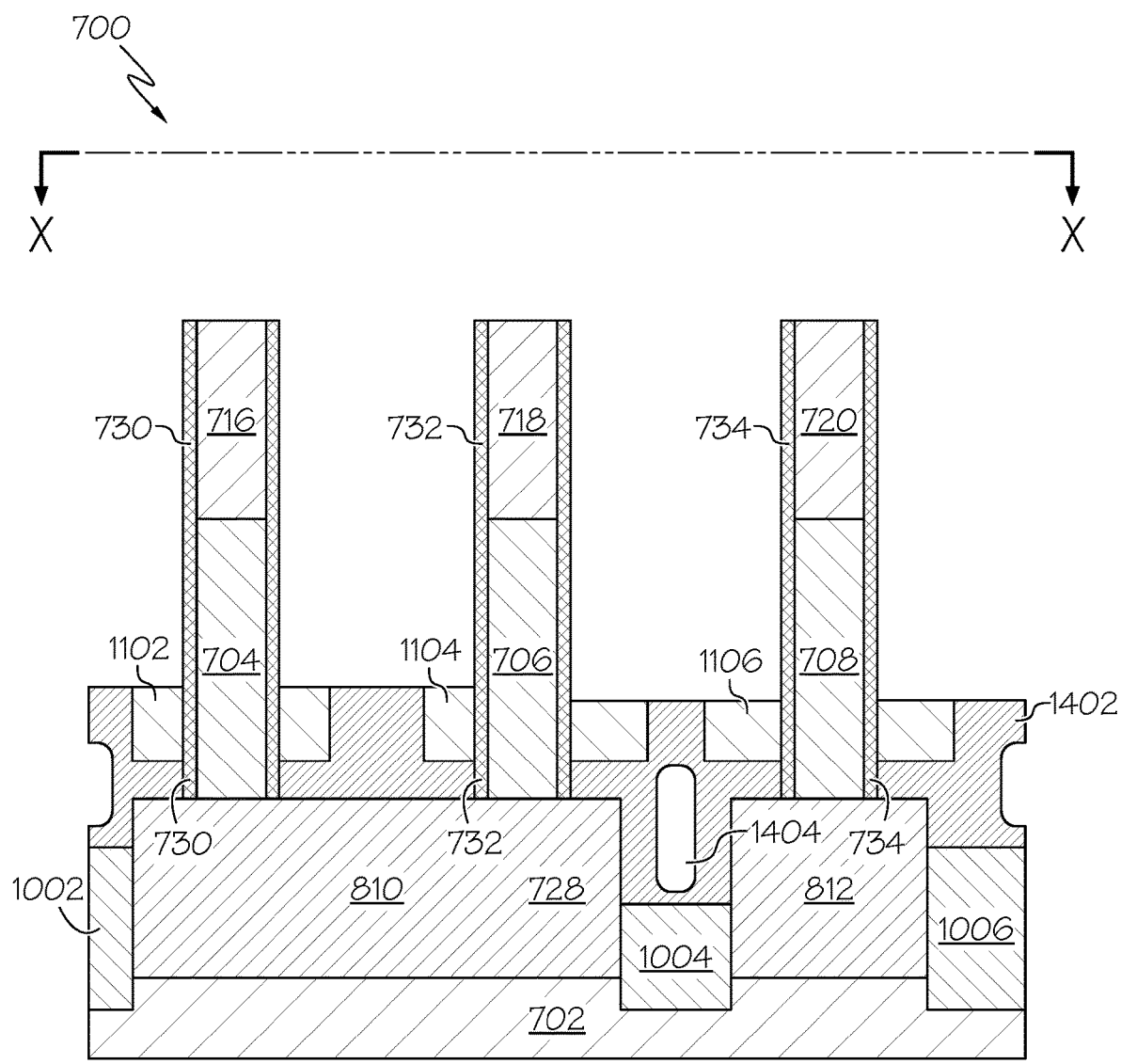
FIG. 14 is a cross-sectional view of the semiconductor device structure after the oxide layers have been removed and a bottom spacer layer has been formed according to another embodiment of the present invention.

FIG. 13 shows that the exposed sacrificial spacers 1102 to 1106 are etched using for example an RIE or wet etch process. As noted above, in some embodiments, there may be non-uniformity in the oxide layers 1202 to 1208 resulting in two or more of the sacrificial spacers 1102 to 1106 comprising different heights after etching. FIG. 14 shows that after the sacrificial spacers 1102 to 1106 have been etched, the selective metal 1008 may be removed and replaced with a bottom spacer layer 1402. For example, in one embodiment, the oxide layers 1202 to 1208 are removed to expose the selective metal 1008. The oxide layers 1202 to 1208 may be removed using an oxide stripping processes such as BHF. The selective metal layer 1008 may then be removed using a process such as room temperature SC1.

The above processes form a cavity between the etched spacers 1102 to 1106 and the bottom source/drain layer 810, 812 and further expose a top portion of the isolation regions 1002 to 1006; a portion of the sidewalls of the bottom source/drain layers 810, 812; a portion of the top surface of the bottom source/drain layer 810, 812; sidewalls of the etched spacers 1102 to 1106; a bottom surface of the etched spacers 1102 to 1106; and a portion of the sidewalls of the liners 730 to 734 below the etched spacers 1102 to 1106. In one embodiment, the cavity is filled with a bottom spacer material to form then bottom spacer layer 1402. The bottom spacer material may be deposited using a conformal deposition process such as ALD, plasma enhanced ALD, CVD, plasma enhanced CVD, or combinations thereof and may comprise an insulating material such as silicon oxide, silicon nitride, silicon oxynitride, a combination of these, and/or the like.

The bottom spacer material fills in the cavity formed between the etched spacers 1102 to 1106 and the bottom source/drain layer 810, 812, and is conformally deposited over the structure 100. The process of forming the bottom spacer layer 1402 may result in an air gap 1404 being formed within the bottom spacer layer 1402 over the isolation regions 1002 to 1006. Excess bottom spacer material may be removed using an isotropic etching process that stops on the etched sacrificial spacers 1102 to 1106. The bottom spacer 1402 may be very uniform in thickness because selective metal layer 1008 was uniform. However, the thickness of the bottom spacer 1402 between the sacrificial spacers 1102 to 1106 may be non-uniform. However, this non-uniformity does not affect the device since these portions of the bottom spacer 1402 are away from the fin-based channel.

Figure 15:
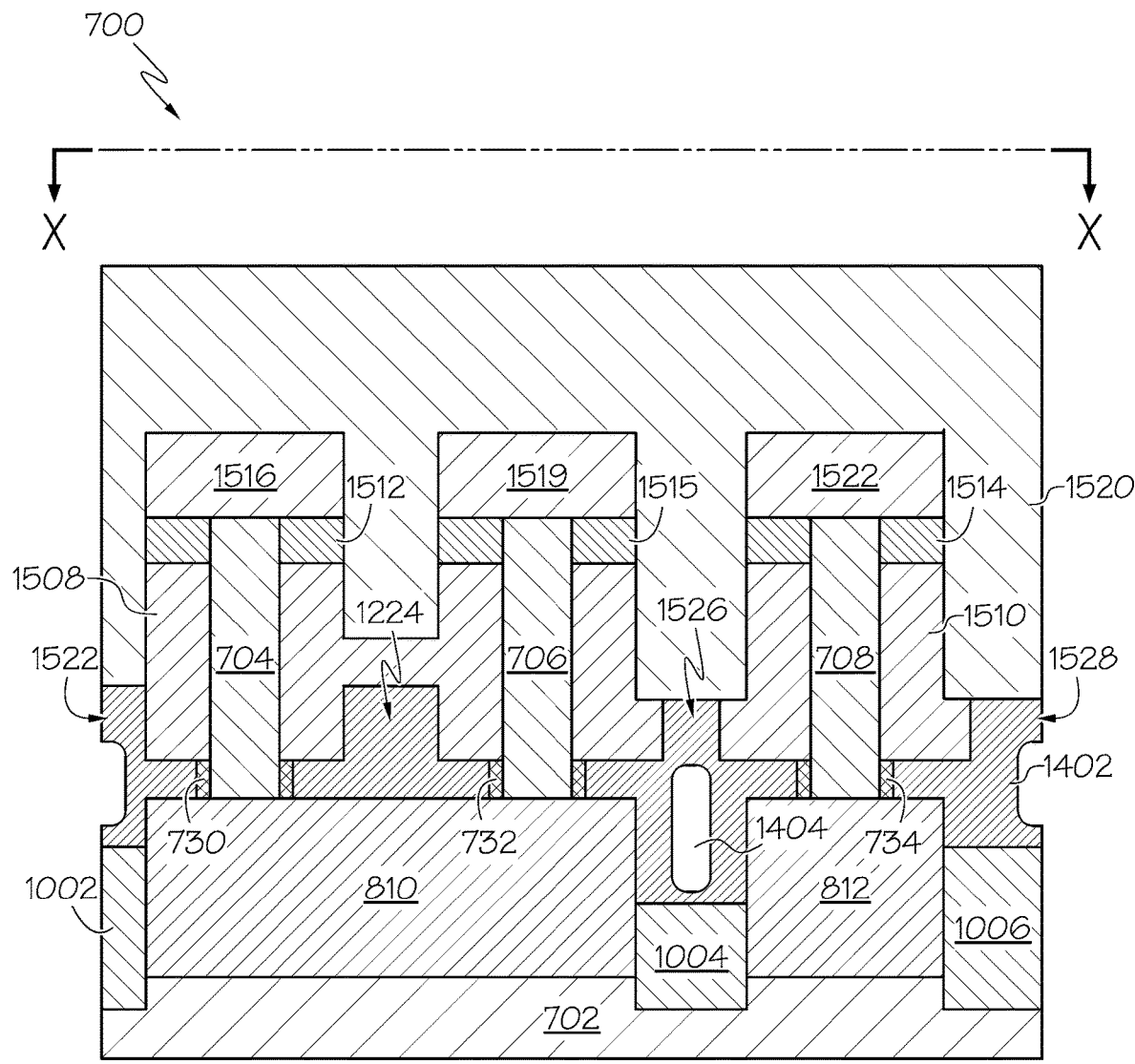
FIG. 15 is a cross-sectional view of the semiconductor device structure after a gate structure, top spacer layer, and top source/drain layer have been formed according to another embodiment of the present invention.

FIG. 15 shows that after the bottom spacer layer 1402 is formed, the remaining portions of the sacrificial spacers 1102 to 1106 are removed using a selective etching process and exposed portions of the liners 730 to 734 are etched down to a corresponding top surface of the bottom spacer layer 1402. As shown in FIG. 15, the bottom spacer layer 1402 comprises a plurality of raised portions 1522 to 1528 in addition to non-raised portions. Additional fabrication processes may then be performed to form one or more gate structures 1508, 1510; one or more top spacer layers 1512, 1514, 1515; one or more top source/drain layers 1516, 1518, 1519; and dielectric layer 1520 similar to that discussed above with respect to FIG. 6. It should be noted that, in some embodiments, the conductor layer of the gate structures 1508, 1510 comprises one or more portions that are planar with a top surface of a corresponding raised portion 1522 to 1528 of the bottom spacer layer 1402.

Figure 16:
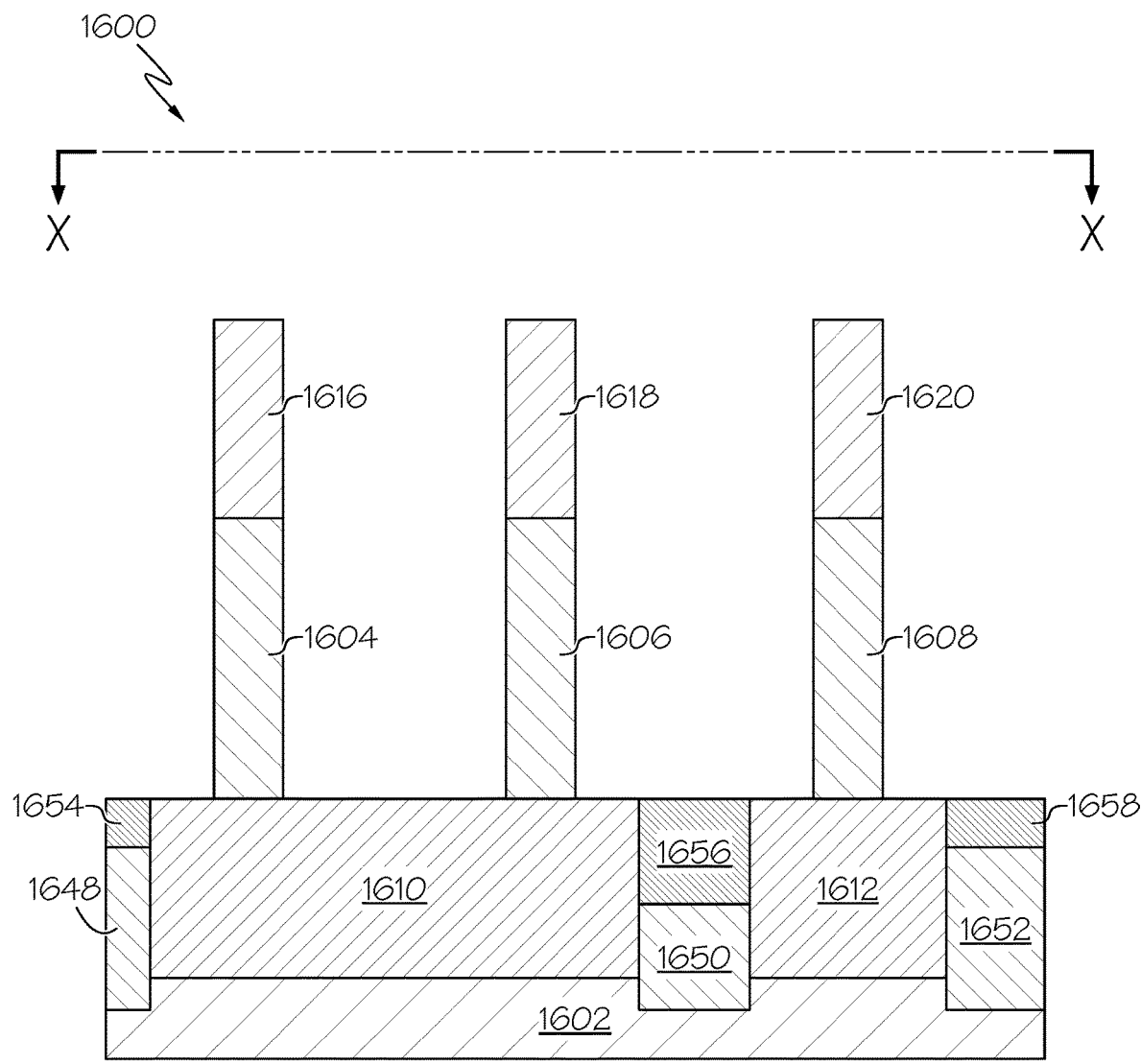
FIG. 16 is a cross-sectional view of a semiconductor device structure after a plurality of fins have been formed on a substrate, active regions have been patterned, isolation regions have been formed, and a dielectric fill layer has been formed according to a further embodiment of the present invention.

FIGS. 16 to 20 illustrate one or more processes for improving the uniformity of VTFET bottom spacers according to a further embodiment of the present invention. FIG. 16 shows a semiconductor device structure 1600 comprising a substrate 1602 at a given point in the fabrication process. For example, FIG. 16 shows the structure 1600 after isolation regions 1648 to 1652 have been formed similar to the isolation regions 1002 to 1006 discussed above with respect to FIG. 10. It should be noted that in this embodiment, an insulating liner has not yet been formed on the fin structures 1604 to 1608. As discussed above, there may be non-uniformity across the isolation regions 1648 to 1652. Therefore, in one embodiment, a divot fill process may be performed to compensate for the non-uniformity by forming one or more dielectric layers 1654 to 1658 in contact with the top surface of the isolation regions 1648 to 1652 and sidewalls of the bottom source/drain layers 1610, 1612.

The divot fill process may be performed by depositing a conformal dielectric layer to pinch-off the bottom space while not pinching-off the space between the semiconductor fins. Then, the dielectric layer may be isotropically etched away such that all exposed portions of dielectric layer at top region is removed, and only those portions of the dielectric layer at the bottom, which are pinched-off, remain. A top surface of the dielectric layers 1654 to 1658 may be planar with a top surface of the bottom source/drain layers 1610, 1612. The dielectric layers 1654 to 1658 may comprise a dielectric material such as silicon oxide, silicon oxycarbide, silicon oxycarbonitride, some other oxide, and/or the like.

Figure 17:
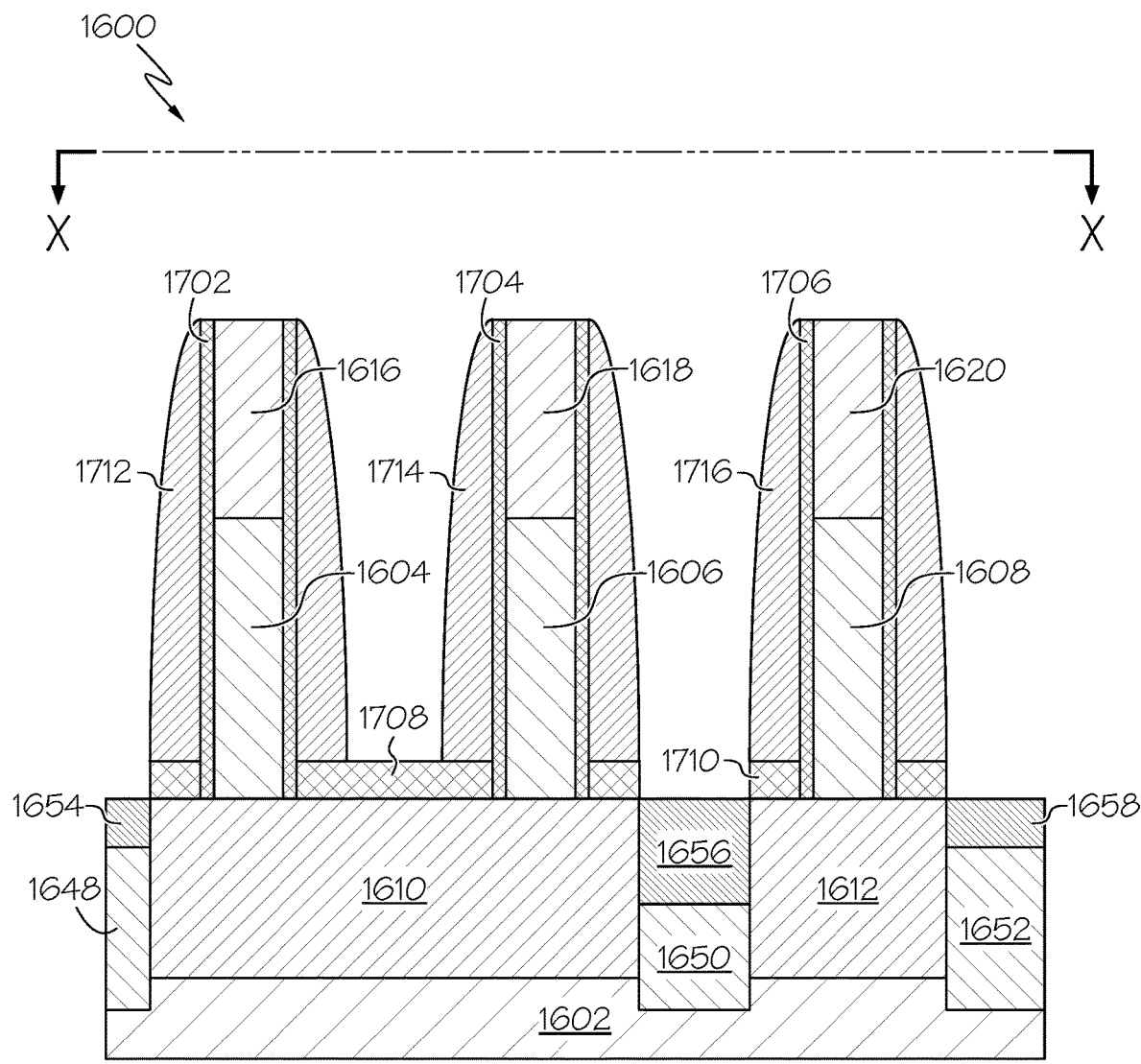
FIG. 17 is a cross-sectional view of the semiconductor device structure after a selective metal layer and sacrificial spacers have been formed according to a further embodiment of the present invention.

FIG. 17 shows that a spacer/liner 1702 to 1706 may be formed in contact with sidewalls of the fin structures 1604 to 1608; sidewalls of the hard masks 1616 to 1620; and the top surface of the bottom source/drain layers 1610, 1612. The spacer/liner 1702 to 1706 may be formed using one or more spacer formation techniques and may comprise an insulating material such as silicon oxide, silicon nitride, silicon oxynitride, a combination of these, and/or the like. One or more selective metal layers 1708, 1710 may then be formed similar to the selective metal layer 1008 discussed above with respect to FIG. 10. The selective metal layers 1708, 1710 may contact a top surface of the bottom source/drain layers 1610, 1612 and a portion of the sidewalls of the liners 1702 to 1706. One or more sacrificial spacers 1712 to 1716 may then be formed in contact with a top surface of the selective metal layers 1708, 1710 and sidewalls of the spacers/liners 1702 to 1706. The sacrificial spacers 1712 to 1716 may be formed using one or more spacer formation techniques and may comprise amorphous silicon or another suitable spacer material(s).

Figure 18:
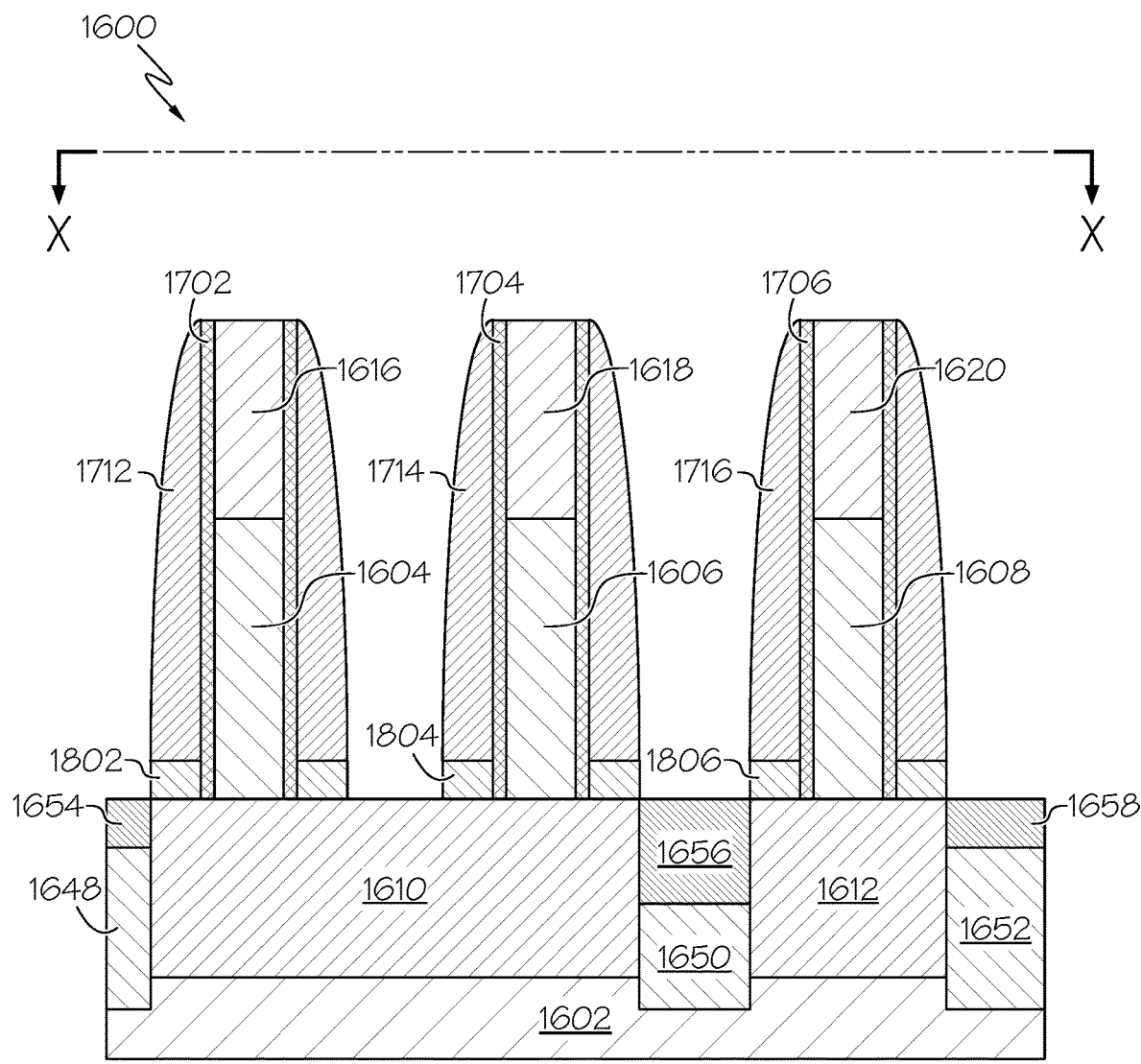
FIG. 18 is a cross-sectional view of the semiconductor device after the selective metal layer has been removed and bottom spacer layers have been formed according to a further embodiment of the present invention.

After the sacrificial spacers 1712 to 1716 have been formed, the selective metal layers 1708, 1710 may be removed and inner spacers 1802 to 1806 (also referred to herein as the "bottom spacer layers 1802 to 1806) may be formed as shown in FIG. 18. For example, the selective metal layers 1708, 1710 may be removed using a process such as room temp SC1 thereby exposing a bottom surface of the sacrificial spacers 1712 to 1716; a top surface of the bottom source/drain layers 1610, 1612; and a lower portion of the sidewalls of the spacers/liners 1702 to 1706. One or more bottom spacer layers 1802 to 1806 may then be formed in contact with the exposed bottom surface of the sacrificial spacers 1712 to 1716; exposed top surface of the bottom source/drain layers 1610, 1612; and exposed lower portion of the sidewalls of the spacers/liners 1702 to 1706.

A deposition process such as ALD, PEALD, CVD, PECVD, or combinations thereof, may be performed to conformally deposit the bottom spacer material. One or more etching processes may be performed to remove any bottom spacer material that does not underly the sacrificial spacers 1712 to 1716. In one or more embodiments, the bottom spacer layers 1802 to 1806 may comprise silicon nitride (SiN), a silicon oxide (SiO), silicon oxynitride (SiON), silicon oxycarbide (SiOC), a silicon boron carbonitride (SiBCN), a silicon oxycarbonitride (SiOCN), a silicon carbide (SiC), a high-k metal oxide, a low-k insulator, or suitable combinations thereof.

Figure 19:
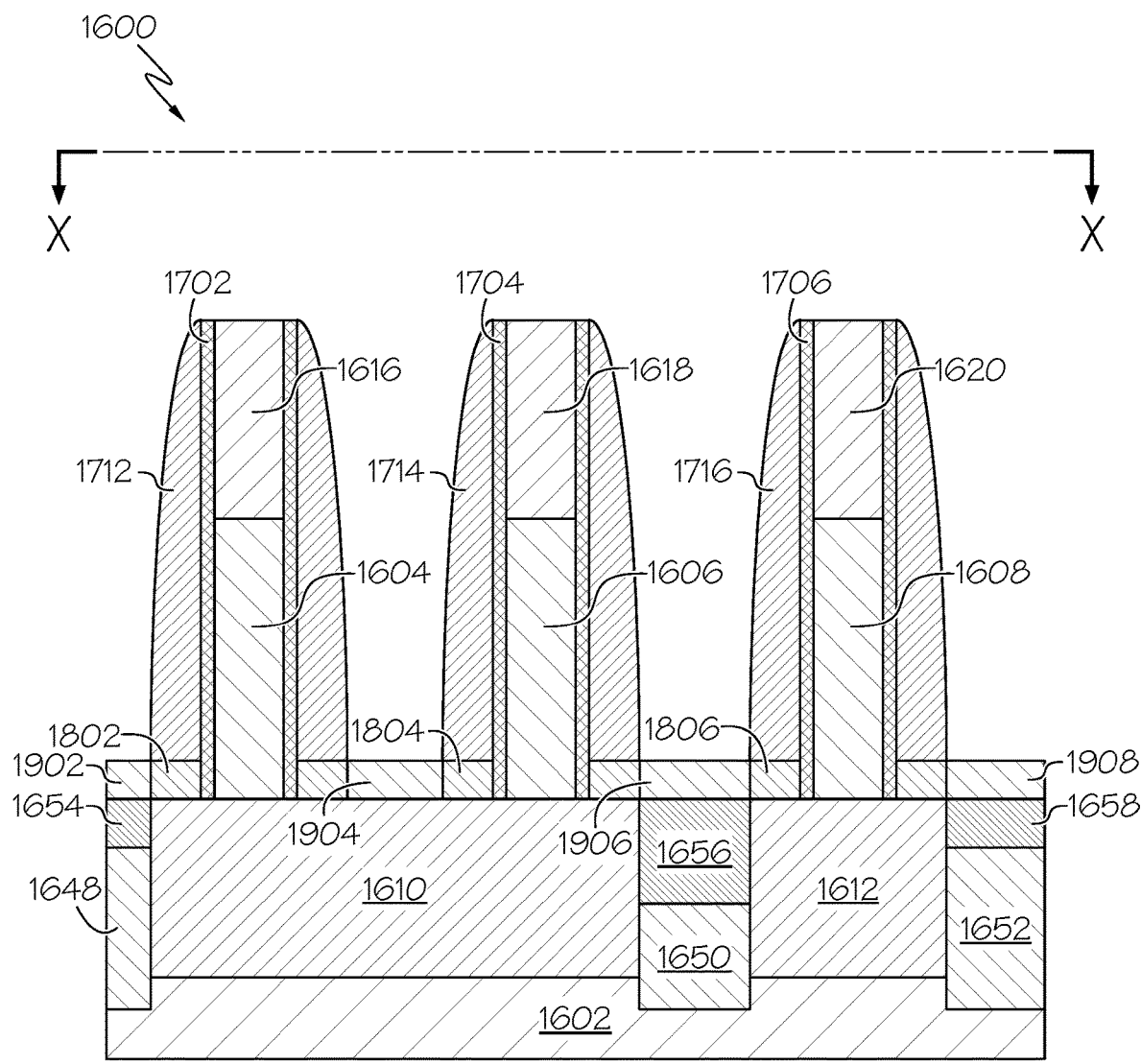
FIG. 19 is a cross-sectional view of the semiconductor device after oxide layers have been formed according to a further embodiment of the present invention.

FIG. 19 shows that after the bottom spacer layers 1802 to 1806 have been formed, oxide layers 1902 to 1908 may be formed adjacent to and in contact with each of the bottom spacer layers 1802 to 1806. One or more of the oxide layers 1902 to 1908 may also be formed on and in contact with a top surface one of the dielectric layers 1654 to 1658, while one or more of the oxide layers 1904 may be formed on and in contact with a top surface of one of the bottom source/drain layers 1610. The oxide layers 1902 to 1908 may be formed/deposited using a directional deposition process such as high density plasma (HDP) or GCIB. An isotropic oxide removal process such as BHF wet etch may then be used to remove any excess oxide.

Figure 20:
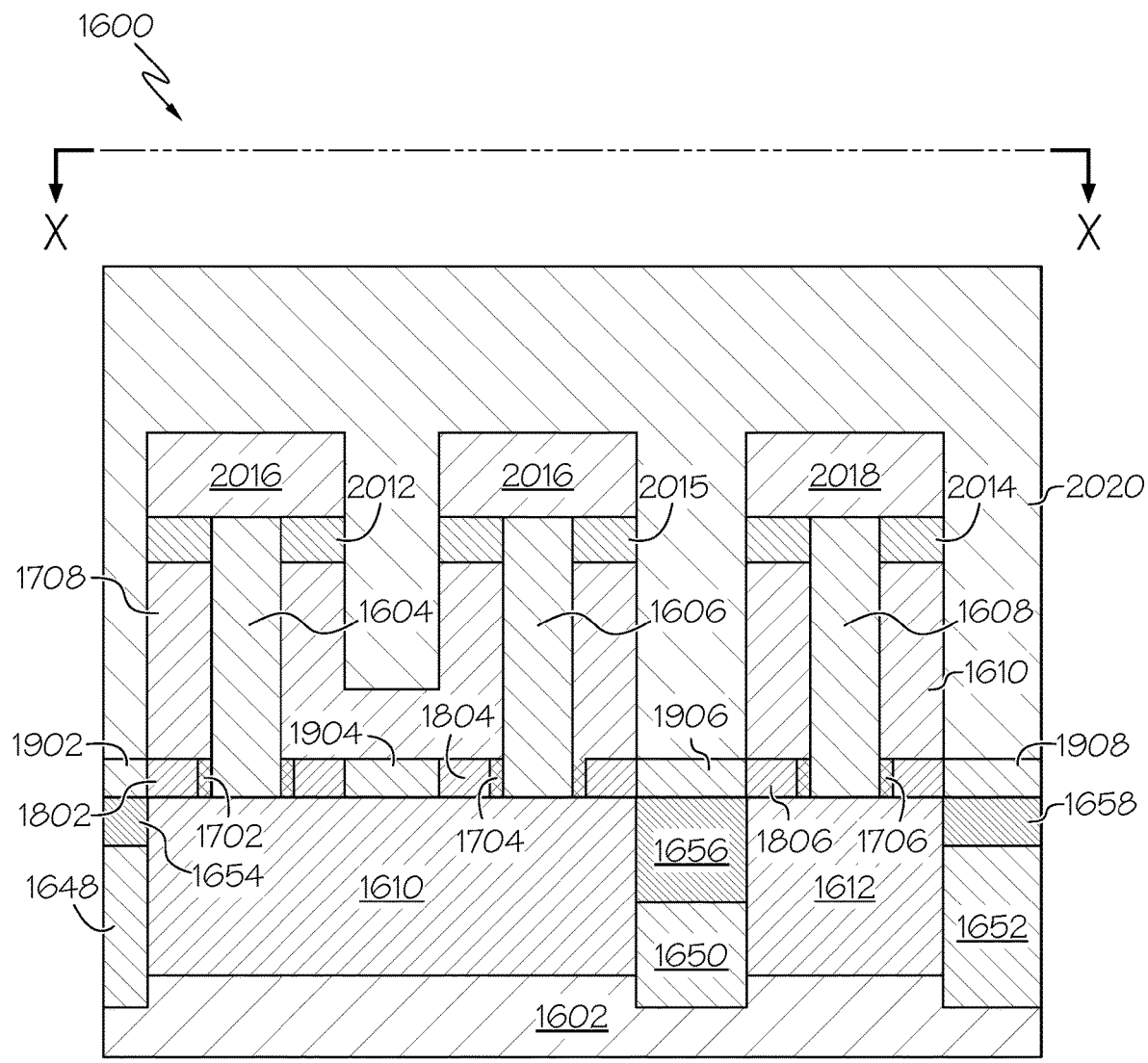
FIG. 20 is a cross-sectional view of the semiconductor device structure after a gate structure, top spacer layer, and top source/drain layer have been formed according to a further embodiment of the present invention.

After the oxide layers 1902 to 1908 have been formed, a selective etching process may be performed to selectively remove the sacrificial spacers 1712 to 1716 as shown in FIG. 20. This process exposes the underlying bottom spacer layers 1802 to 1806. The spacers/liners 1702 to 1706 may then be selectively etched down to the top surface of the bottom spacer layers 1802 to 1806. FIG. 20 further shows that additional fabrication processes may then be performed to form one or more gate structures 2008, 2010; one or more top spacer layers 2012, 2014, 2015; one or more top source/drain layers 2016, 2018, 2019; and dielectric layer 2020 similar to those discussed above with respect to FIG. 6.

Figure 21:
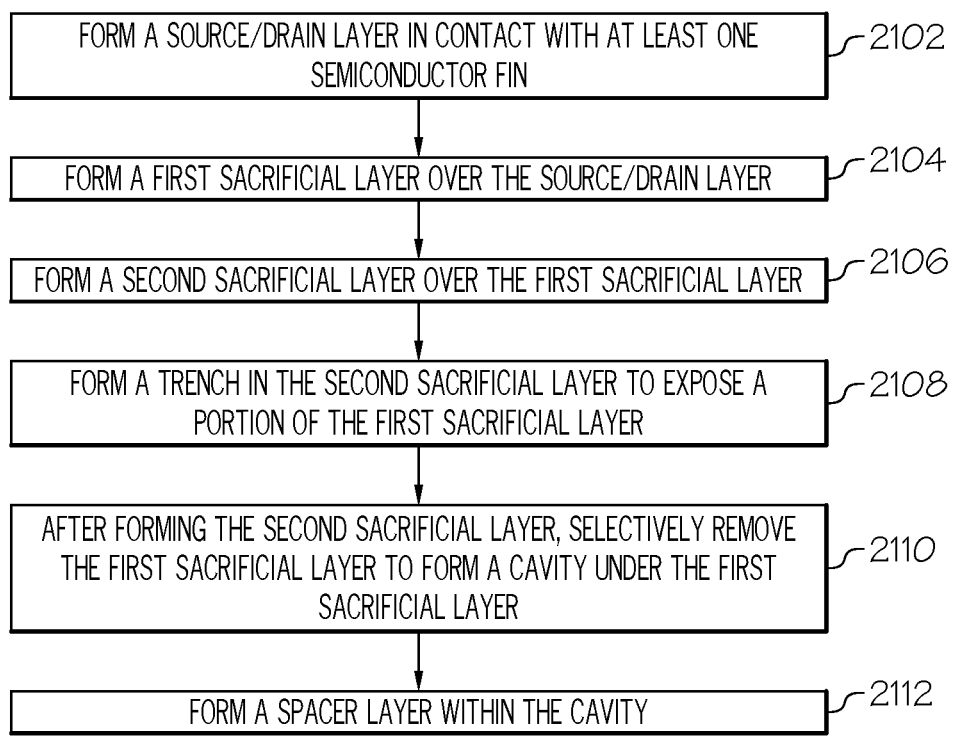
FIG. 21 is an operational flow diagram illustrating one example of a process for forming a vertical channel semiconductor structure according to one embodiment of the present invention.

FIG. 21 is an operational flow diagram illustrating one example of a process for forming a vertical channel semiconductor structure. It should be noted that each of the steps shown in FIG. 21 have been discussed in greater detail above with respect to FIGS. 1 to 6. In this example, a source/drain layer is formed in contact with at least one semiconductor fin at step 2102. A first sacrificial layer is formed over the source/drain layer at step 2104. A second sacrificial layer is formed over the first sacrificial layer at step 2106. A trench is formed in the second sacrificial layer to expose a portion of the first sacrificial layer at step 2108. After forming the second sacrificial layer, the first sacrificial layer is selectively removed to form a cavity under the first sacrificial layer at step 2110. A spacer layer is then formed within the cavity at step 2112.

Figure 22:
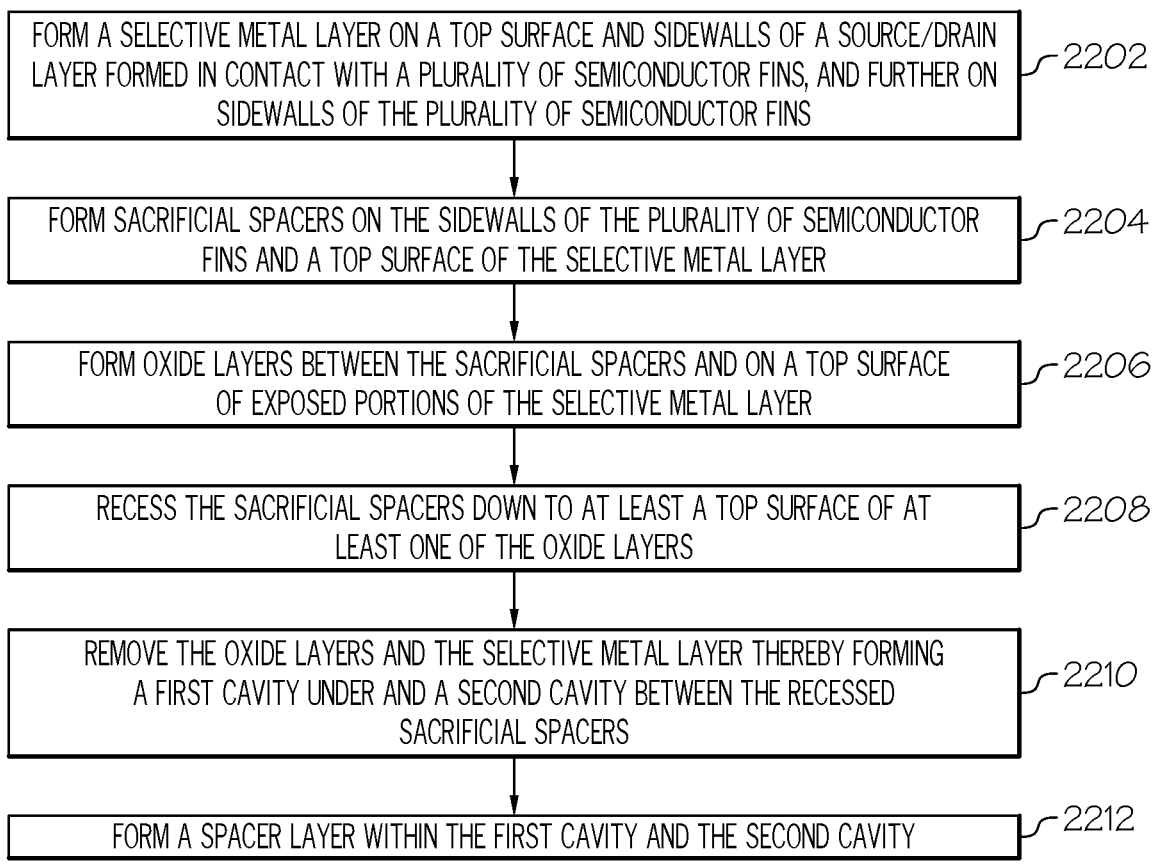
FIG. 22 is an operational flow diagram illustrating one example of a process for forming a vertical channel semiconductor structure according to another embodiment of the present invention.

FIG. 22 is an operational flow diagram illustrating one example of another process for forming a vertical channel semiconductor structure. It should be noted that each of the steps shown in FIG. 22 has been discussed in greater detail above with respect to FIGS. 7 to 15. In this example, a selective metal layer is formed on a top surface and sidewalls of a source/drain layer formed in contact with a plurality of semiconductor fins, and further on sidewalls of the plurality of semiconductor fins at step 2202. Sacrificial spacers are formed on the sidewalls of the plurality of semiconductor fins and a top surface of the selective metal layer at step 2204. Oxide layers are formed between the sacrificial spacers and on a top surface of exposed portions of the selective metal layer at step 2206. The sacrificial spacers are recessed down to at least a top surface of at least one of the oxide layers at step 2208. The oxide layers and the selective metal layer are removed forming a first cavity under and a second cavity between the recessed sacrificial spacers at step 2210. A spacer layer is formed within the first cavity and the second cavity at step 2212.

Figure 23:
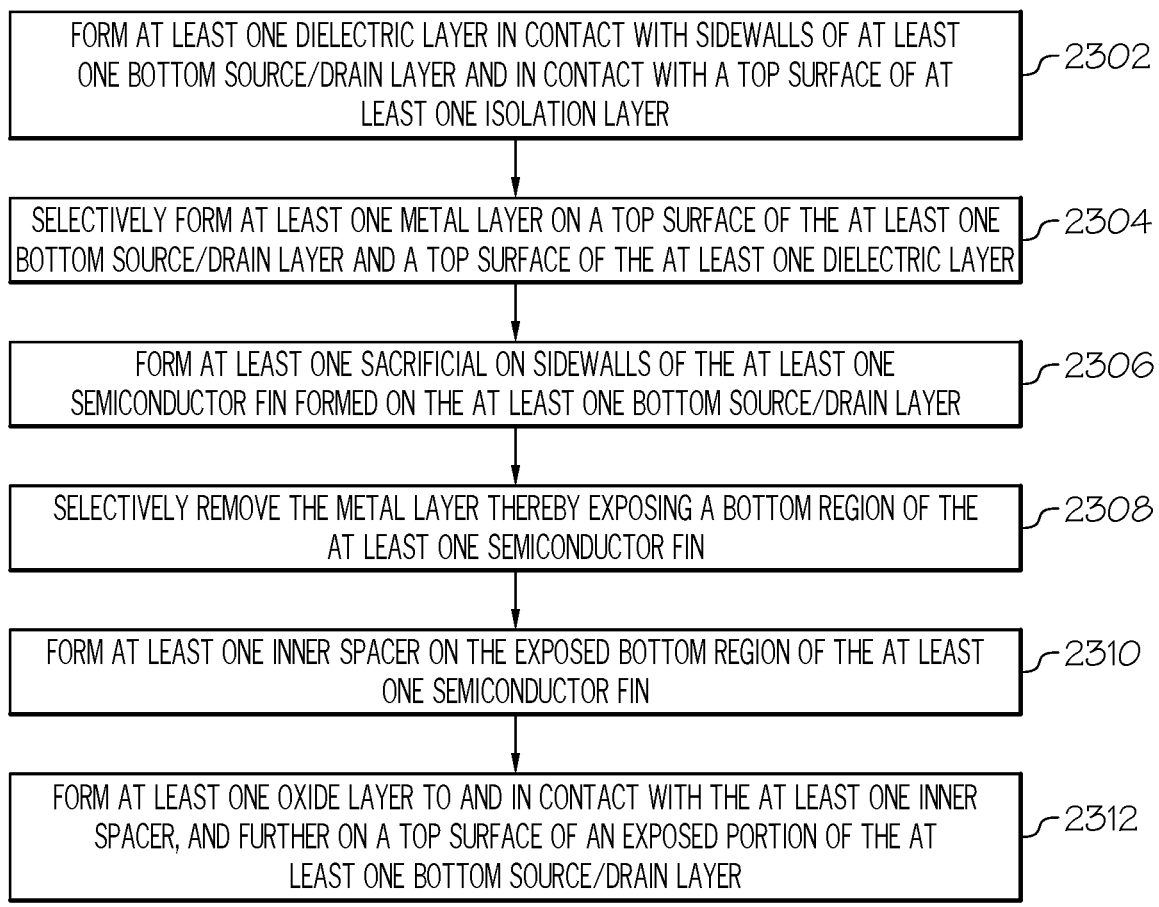
FIG. 23 is an operational flow diagram illustrating one example of a process for forming a vertical channel semiconductor structure according to a further embodiment of the present invention.

FIG. 23 is an operational flow diagram illustrating one example of a further process for forming a vertical channel semiconductor structure. It should be noted that each of the steps shown in FIG. 23 have been discussed in greater detail above with respect to FIGS. 16 to 20. In this example, at least one dielectric layer is formed in contact with sidewalls of at least one bottom source/drain layer and in contact with a top surface of at least one isolation layer at step 2302. At least one metal layer is selectively formed on a top surface of the at least one bottom source/drain layer and a top surface of the at least one dielectric layer at step 2304. At least one sacrificial spacer is formed on sidewalls of the at least one semiconductor fin formed on the at least one bottom source/drain layer at step 2306. The metal layer is selectively removed exposing a bottom region of the at least one semiconductor fin at step 2308. At least one inner spacer is formed on the exposed bottom region of the at least one semiconductor fin at step 2310. At least one oxide layer is formed adjacent to and in contact with the at least one inner spacer, and is further formed on a top surface of an exposed portion of the at least one bottom source/drain layer at step 2312.

Although specific embodiments have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method of forming a vertical channel semiconductor structure, the method comprising:
    forming a source/drain layer in contact with at least one semiconductor fin;
    forming a first sacrificial layer over the source/drain layer;
    forming a second sacrificial layer over the first sacrificial layer;
    forming a trench in the second sacrificial layer to expose a portion of the first sacrificial layer;
    after forming the second sacrificial layer, selectively removing the first sacrificial layer forming a cavity directly under the second sacrificial layer; and
    forming a spacer layer within the cavity and directly under the second sacrificial layer.

2. The method of claim 1, wherein a seam is formed within the spacer layer.

3. The method of claim 1, further comprising:
    forming a cap layer on and in contact with the source/drain layer prior to forming the first sacrificial layer.

4. The method of claim 1, further comprising:
    forming a supporting layer over the at least one semiconductor fin and the first sacrificial layer over the source/drain layer, wherein the second sacrificial layer is formed on and in contact with the supporting layer.

5. The method of claim 1, further comprising:
    forming a metal gate structure in contact with sidewalls of the at least one semiconductor fin and a portion of the spacer layer; and
    forming an additional spacer layer above the spacer layer and in contact with a top surface of the metal gate structure and sidewalls of the at least one semiconductor fin.

6. The method of claim 5, further comprising:
    forming an additional source/drain layer above the source/drain layer and in contact with a top surface of the additional spacer layer and a top surface of the at least one semiconductor fin.

7. The method of claim 6, further comprising:
    forming one or more contacts on at least one of the source/drain layer, the additional source/drain layer, or the metal gate structure.

8. A method of forming a vertical channel semiconductor structure, the method comprising:
    forming a source/drain layer in contact with at least one semiconductor fin;
    forming a first sacrificial layer over the source/drain layer;
    forming a second sacrificial layer over the first sacrificial layer;
    forming a trench in the second sacrificial layer to expose a portion of the first sacrificial layer;
    after forming the second sacrificial layer, selectively removing the first sacrificial layer forming a cavity directly under the second sacrificial layer; and
    forming a spacer layer within the cavity between the bottom surface of the second sacrificial layer and the top surface of the source/drain.

9. The method of claim 8, wherein a seam is formed within the spacer layer.

10. The method of claim 8, further comprising:
    forming a cap layer on and in contact with the source/drain layer prior to forming the first sacrificial layer.

11. The method of claim 8, further comprising:
    forming a supporting layer over the at least one semiconductor fin and the first sacrificial layer over the source/drain layer, wherein the second sacrificial layer is formed on and in contact with the supporting layer.

12. The method of claim 8, further comprising:
    forming a metal gate structure in contact with sidewalls of the at least one semiconductor fin and a portion of the spacer layer; and
    forming an additional spacer layer above the spacer layer and in contact with a top surface of the metal gate structure and sidewalls of the at least one semiconductor fin.

13. The method of claim 12, further comprising:
    forming an additional source/drain layer above the source/drain layer and in contact with a top surface of the additional spacer layer and a top surface of the at least one semiconductor fin.

14. The method of claim 13, further comprising:
    forming one or more contacts on at least one of the source/drain layer, the additional source/drain layer, or the metal gate structure.

15. A method of forming a vertical channel semiconductor structure, the method comprising:
    forming a source/drain layer in contact with at least one semiconductor fin;
    forming a first sacrificial layer over the source/drain layer;
    forming a second sacrificial layer over the first sacrificial layer;
    forming a trench in the second sacrificial layer to expose a portion of the first sacrificial layer;
    after forming the second sacrificial layer, selectively removing the first sacrificial layer forming a cavity directly under the second sacrificial layer and above the top surface of the source/drain layer; and
    forming a spacer layer within the cavity.

16. The method of claim 15, wherein a seam is formed within the spacer layer.

17. The method of claim 15, further comprising:
    forming a cap layer on and in contact with the source/drain layer prior to forming the first sacrificial layer.

18. The method of claim 8, further comprising:
    forming a supporting layer over the at least one semiconductor fin and the first sacrificial layer over the source/drain layer, wherein the second sacrificial layer is formed on and in contact with the supporting layer.

19. The method of claim 15, further comprising:
    forming a metal gate structure in contact with sidewalls of the at least one semiconductor fin and a portion of the spacer layer; and
    forming an additional spacer layer above the spacer layer and in contact with a top surface of the metal gate structure and sidewalls of the at least one semiconductor fin.

20. The method of claim 19, further comprising:
    forming an additional source/drain layer above the source/drain layer and in contact with a top surface of the additional spacer layer and a top surface of the at least one semiconductor fin.

* * * * *